United States Patent
Kubo et al.

(10) Patent No.: US 8,207,518 B2
(45) Date of Patent: Jun. 26, 2012

(54) INFORMATION RECORDING AND REPRODUCING DEVICE

(75) Inventors: Kohichi Kubo, Kanagawa-ken (JP); Chikayoshi Kamata, Kanagawa-ken (JP); Takayuki Tsukamoto, Kanagawa-ken (JP); Shinya Aoki, Kanagawa-ken (JP); Takahiro Hirai, Kanagawa-ken (JP); Tsukasa Nakai, Tokyo (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 12/885,719

(22) Filed: Sep. 20, 2010

(65) Prior Publication Data

US 2011/0006277 A1 Jan. 13, 2011

Related U.S. Application Data

(63) Continuation of application No. PCT/JP2008/056492, filed on Apr. 1, 2008.

(51) Int. Cl.
*H01L 29/02* (2006.01)
(52) U.S. Cl. . 257/2; 257/4; 257/E31.029; 257/E27.004; 257/E45.002; 365/148
(58) Field of Classification Search .................. 257/2, 4, 257/E31.029, E27.004, E45.002; 438/95; 365/148, 189, 218
See application file for complete search history.

(56) References Cited

U.S. PATENT DOCUMENTS

| | | | |
|---|---|---|---|
| 2007/0133358 A1 | 6/2007 | Kubo et al. | |
| 2007/0285966 A1* | 12/2007 | Toda et al. | 365/148 |
| 2007/0285967 A1* | 12/2007 | Toda et al. | 365/148 |

FOREIGN PATENT DOCUMENTS

| | | |
|---|---|---|
| JP | 2006-080259 | 3/2006 |
| JP | 2007-080311 | 3/2007 |
| JP | 2007-273618 | 10/2007 |
| JP | 2007-299436 | 11/2007 |
| JP | 2008-021750 | 1/2008 |

* cited by examiner

*Primary Examiner* — Brook Kebede
(74) *Attorney, Agent, or Firm* — Oblon, Spivak, McClelland, Maier & Neustadt, L.L.P.

(57) ABSTRACT

According to one embodiment, an information recording and reproducing device includes a first layer, a second layer and a recording layer. The recording layer is provided between the first layer and the second layer and being capable of reversibly changing between a first state having a first resistance and a second state having a second resistance higher than the first resistance by a current supplied via the first layer and the second layer. The recording layer includes a first compound layer and an insulating layer. The first compound layer contains a first compound. The first compound includes a first cation element and a second cation element of a type different from the first cation element. The insulating layer contains a third compound, and the third compound includes an element selected from group 1 to 4 elements and group 12 to 17 elements in the periodic table.

20 Claims, 29 Drawing Sheets

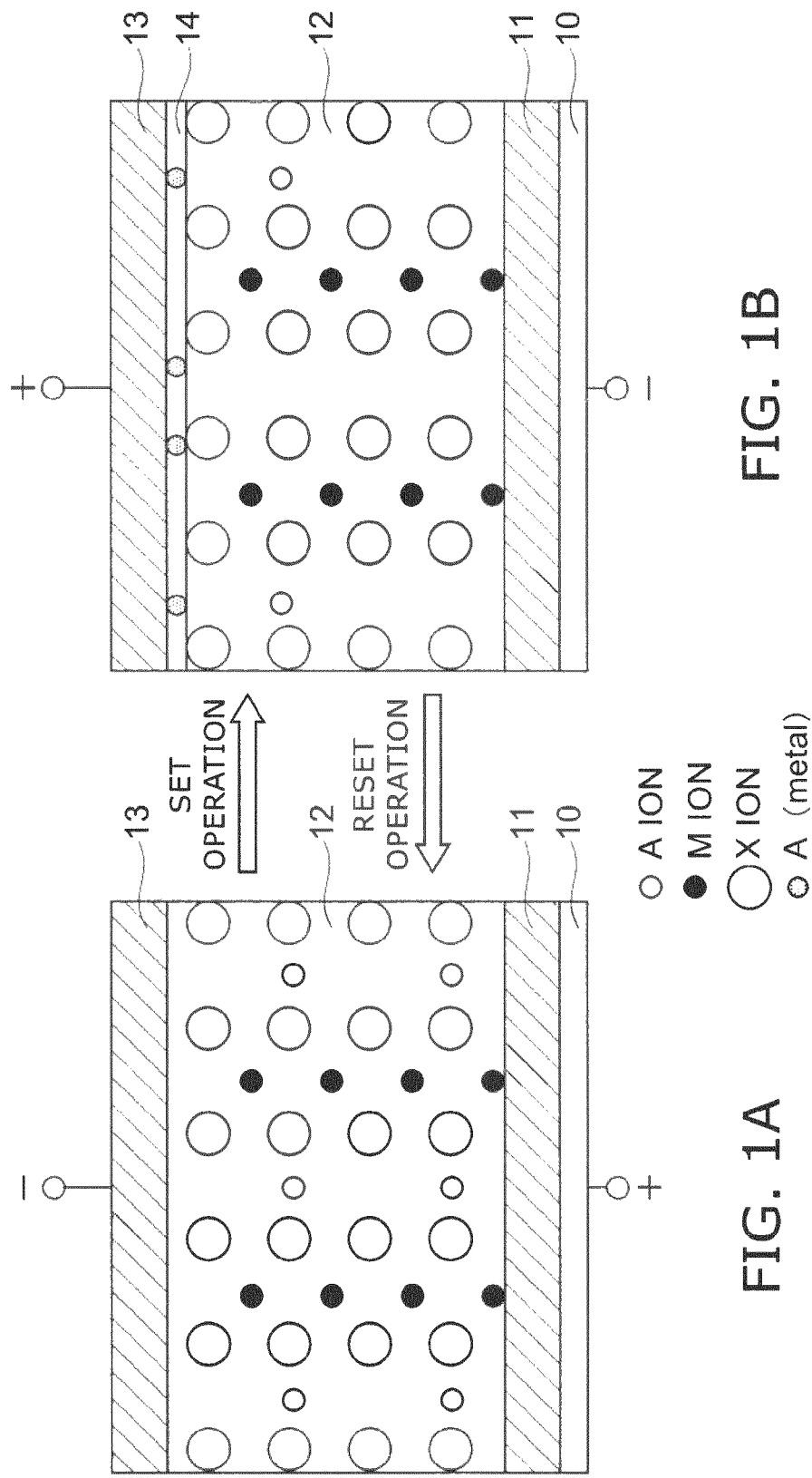

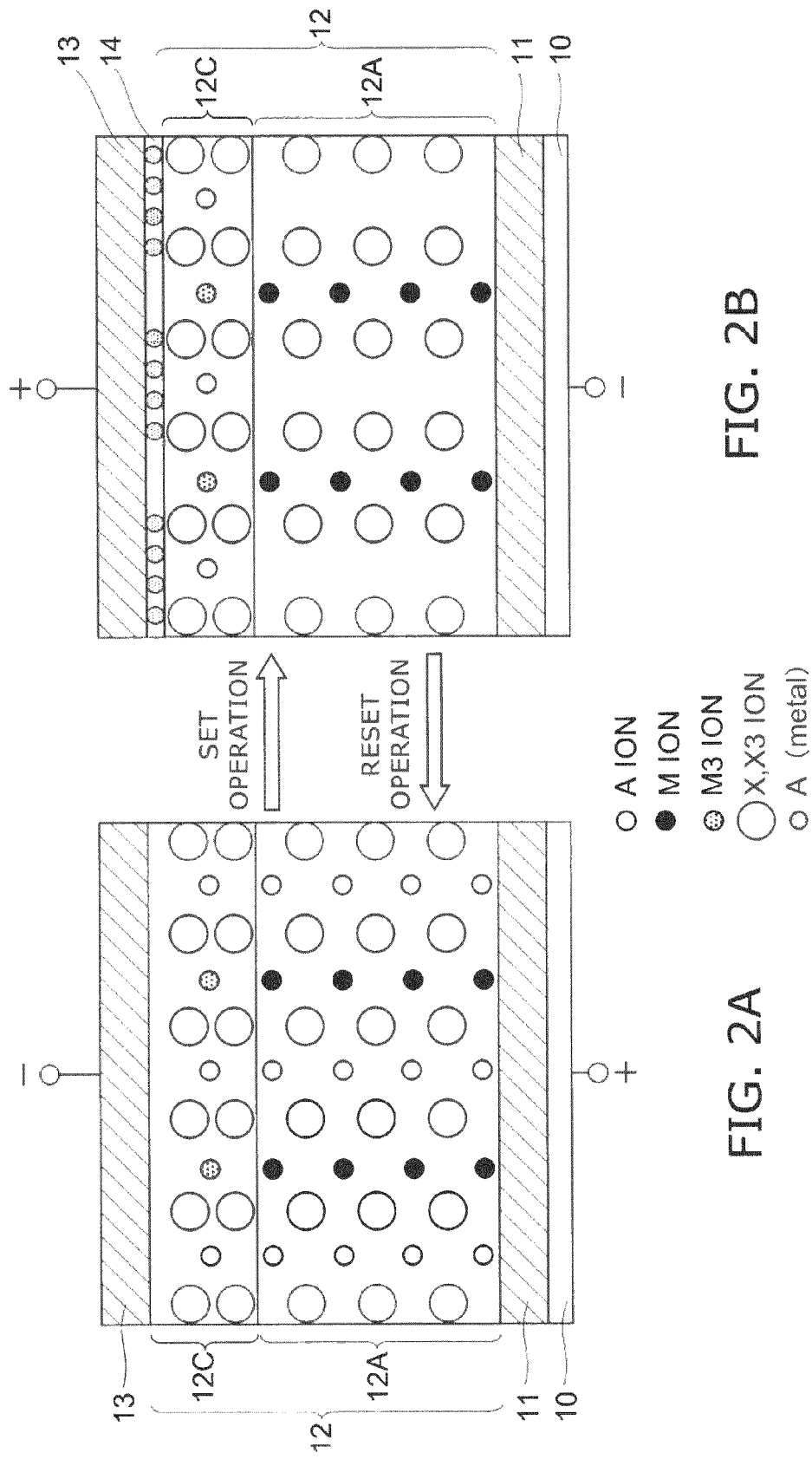

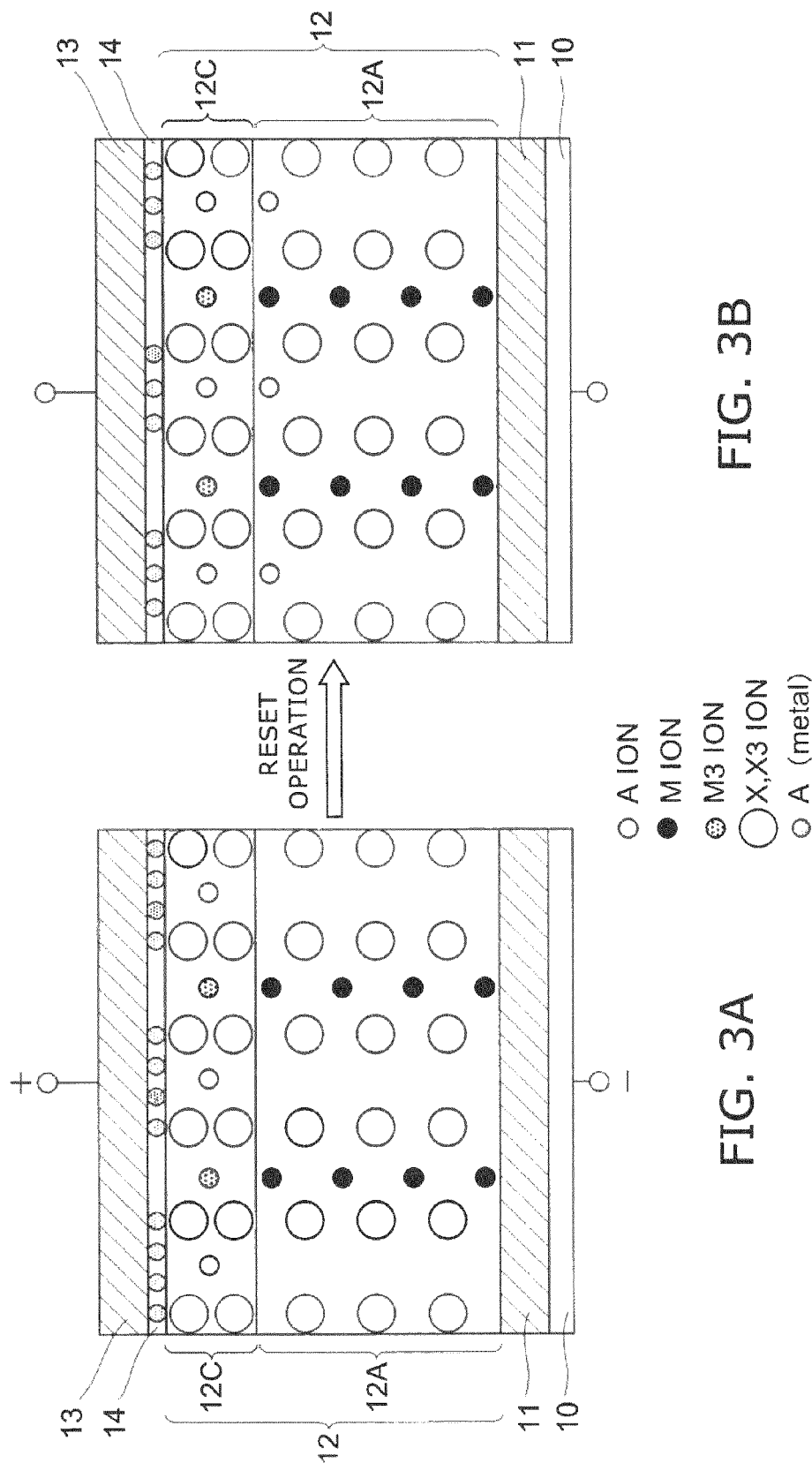

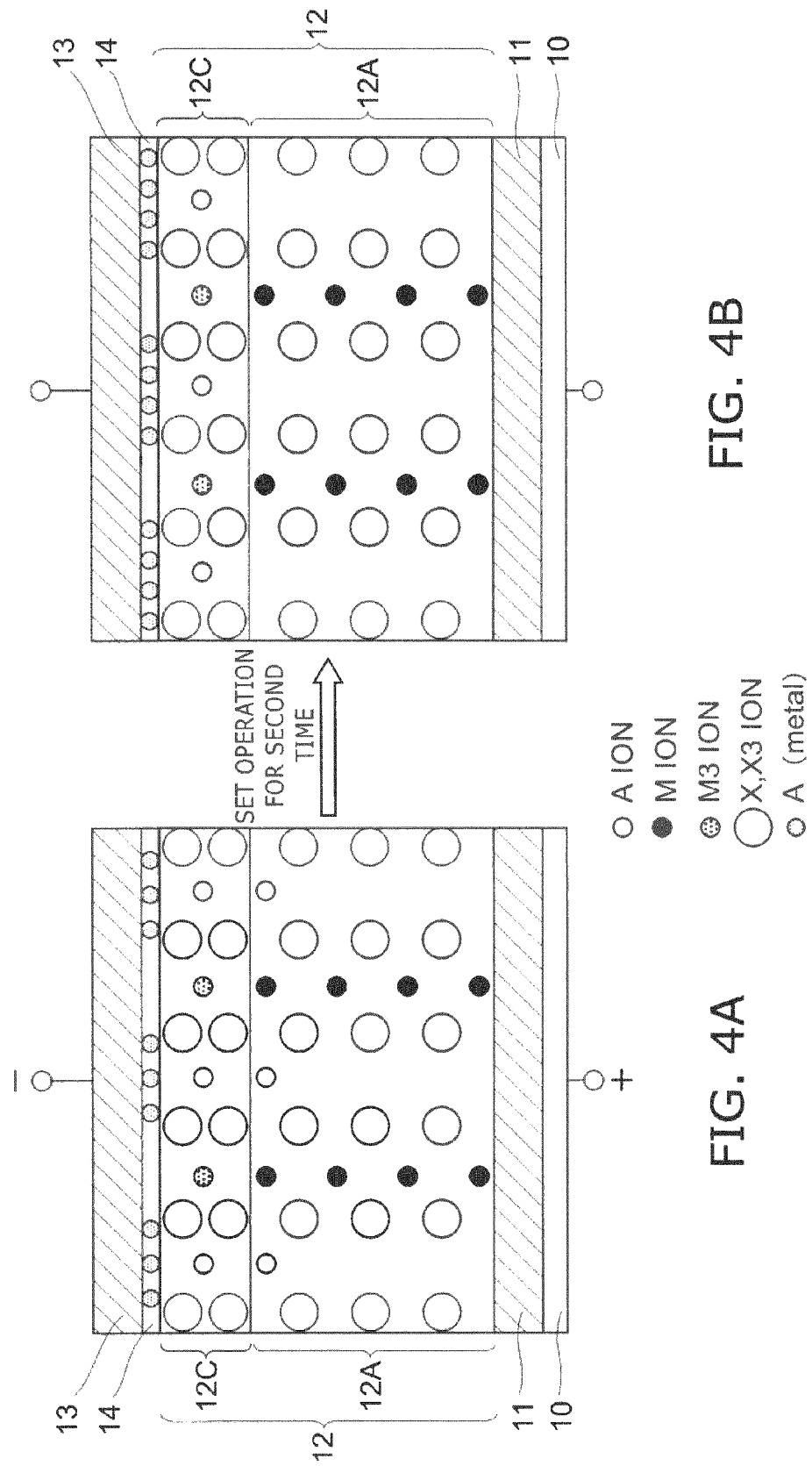

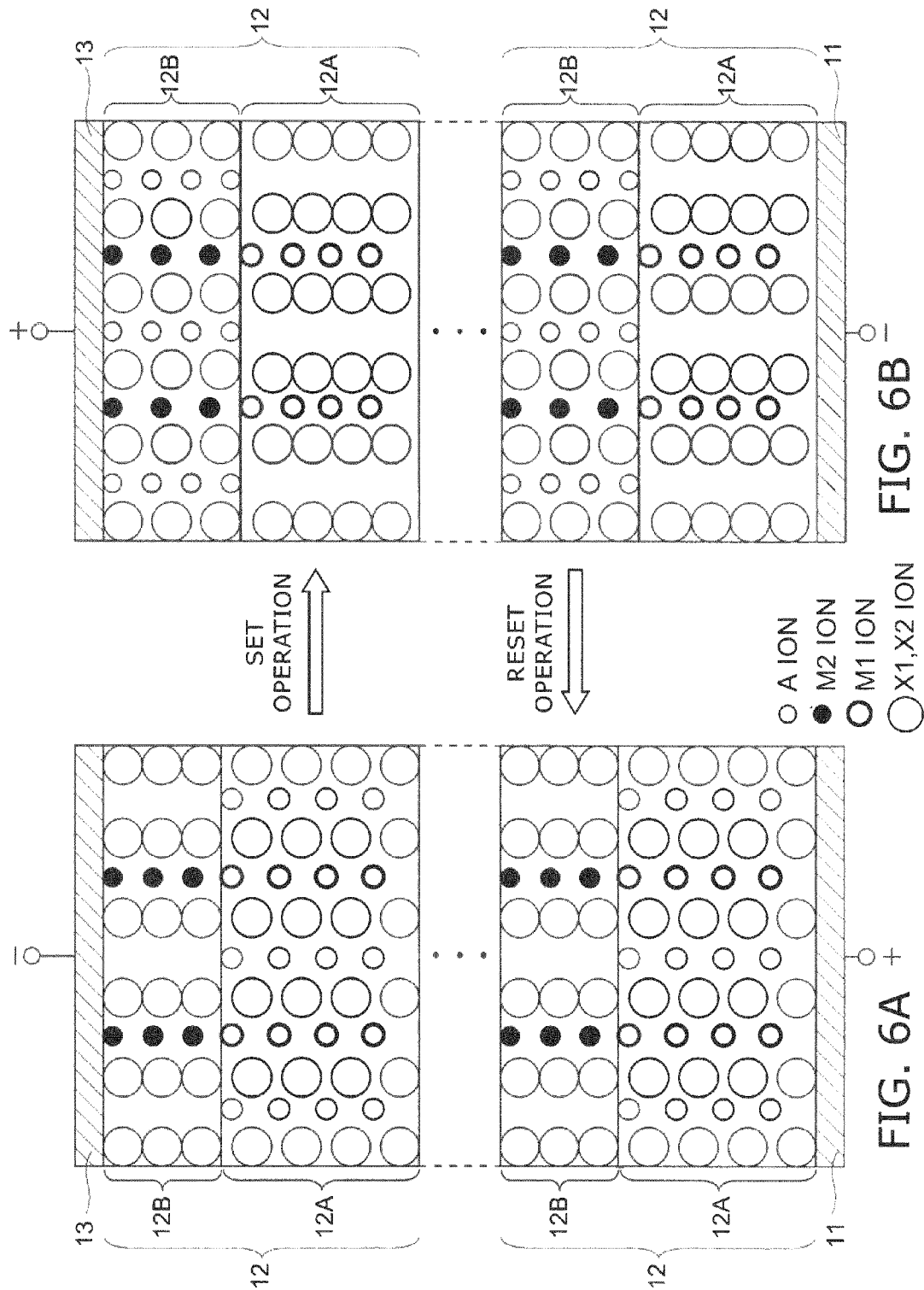

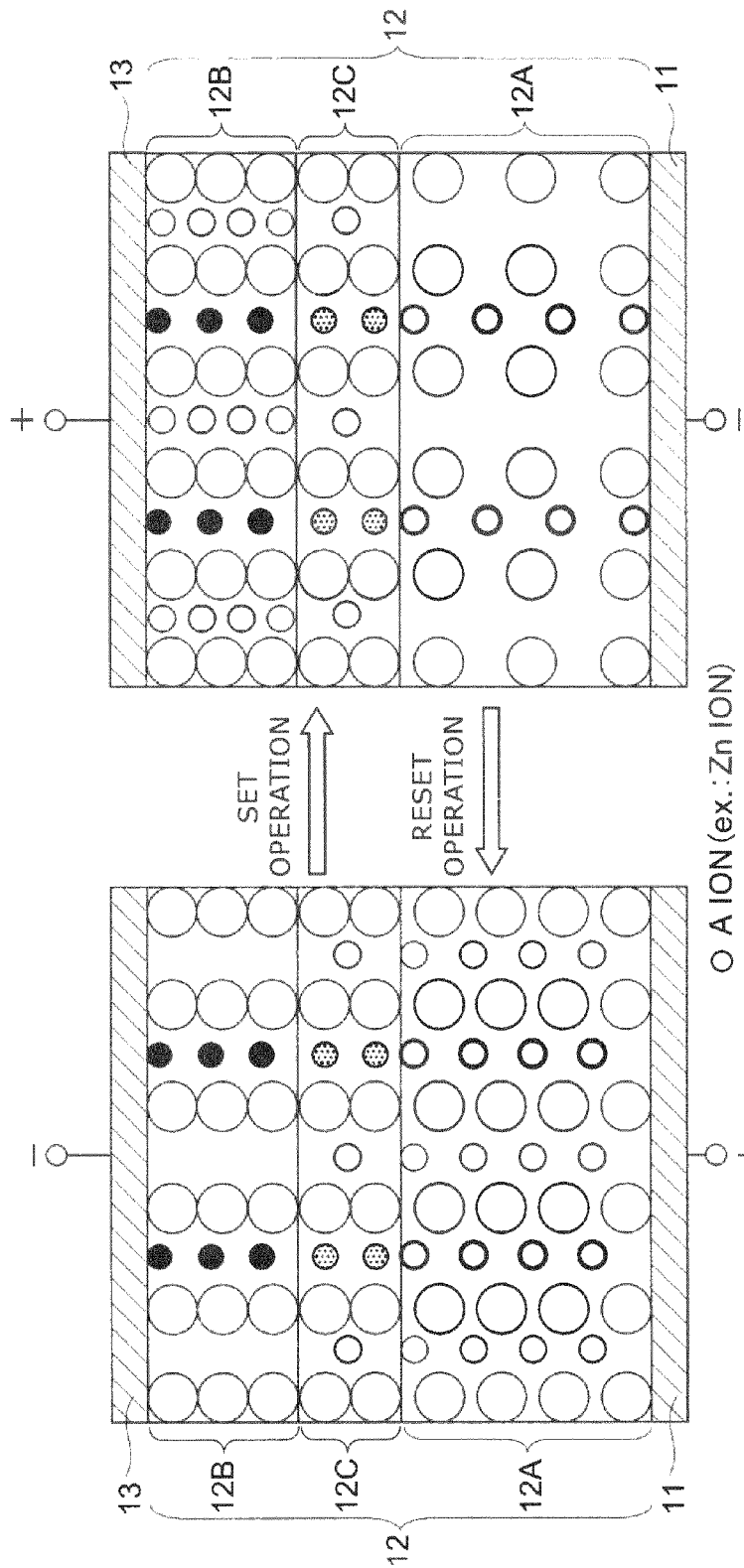

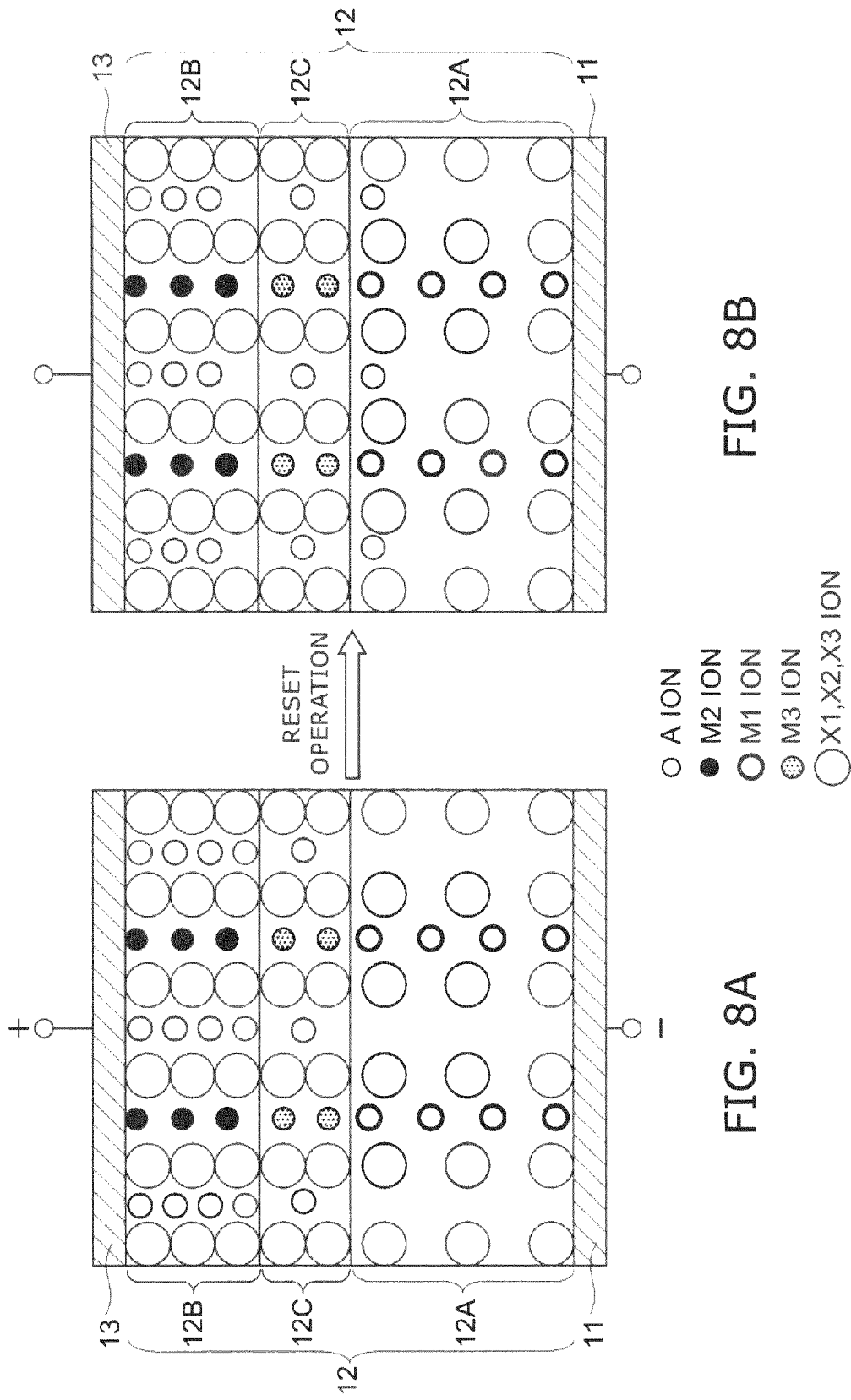

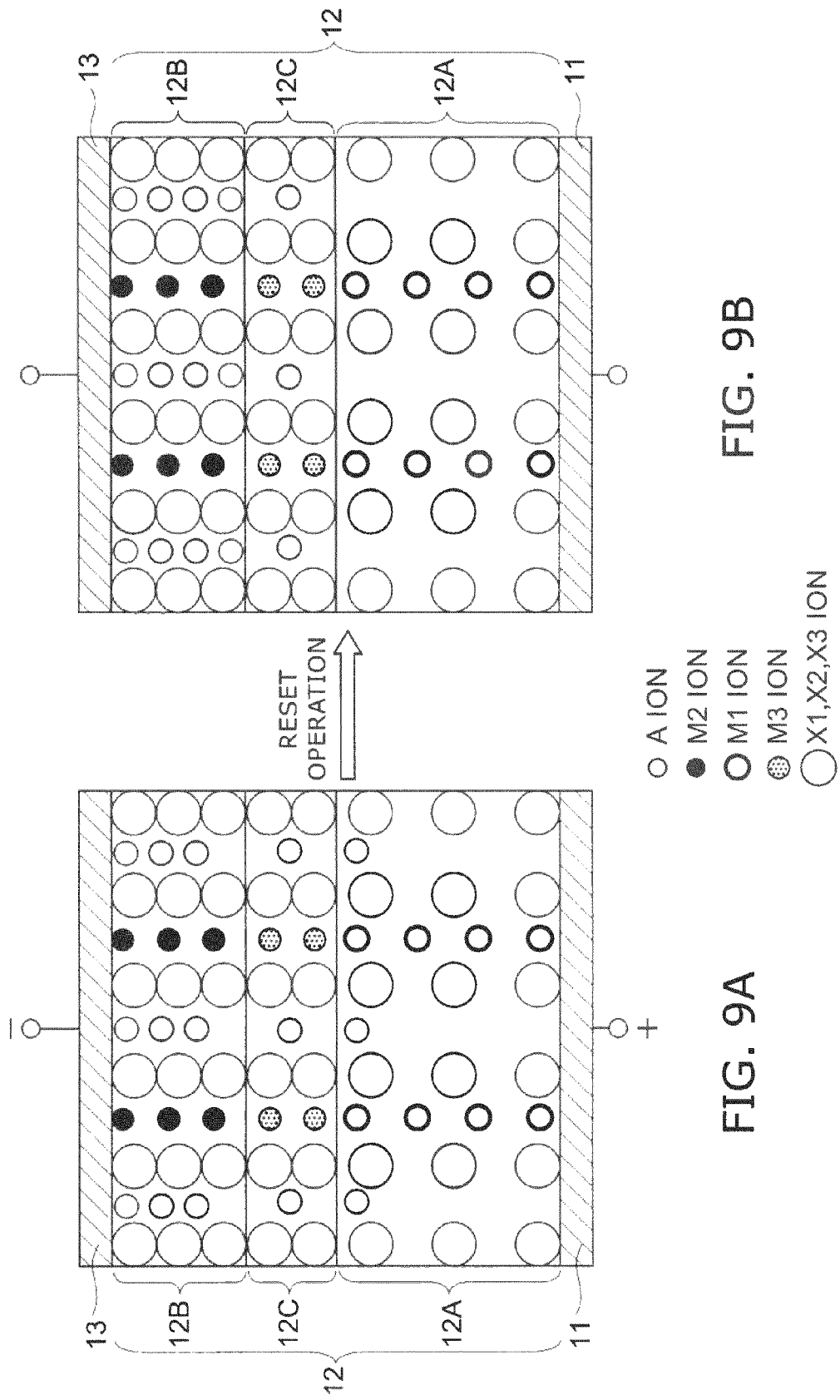

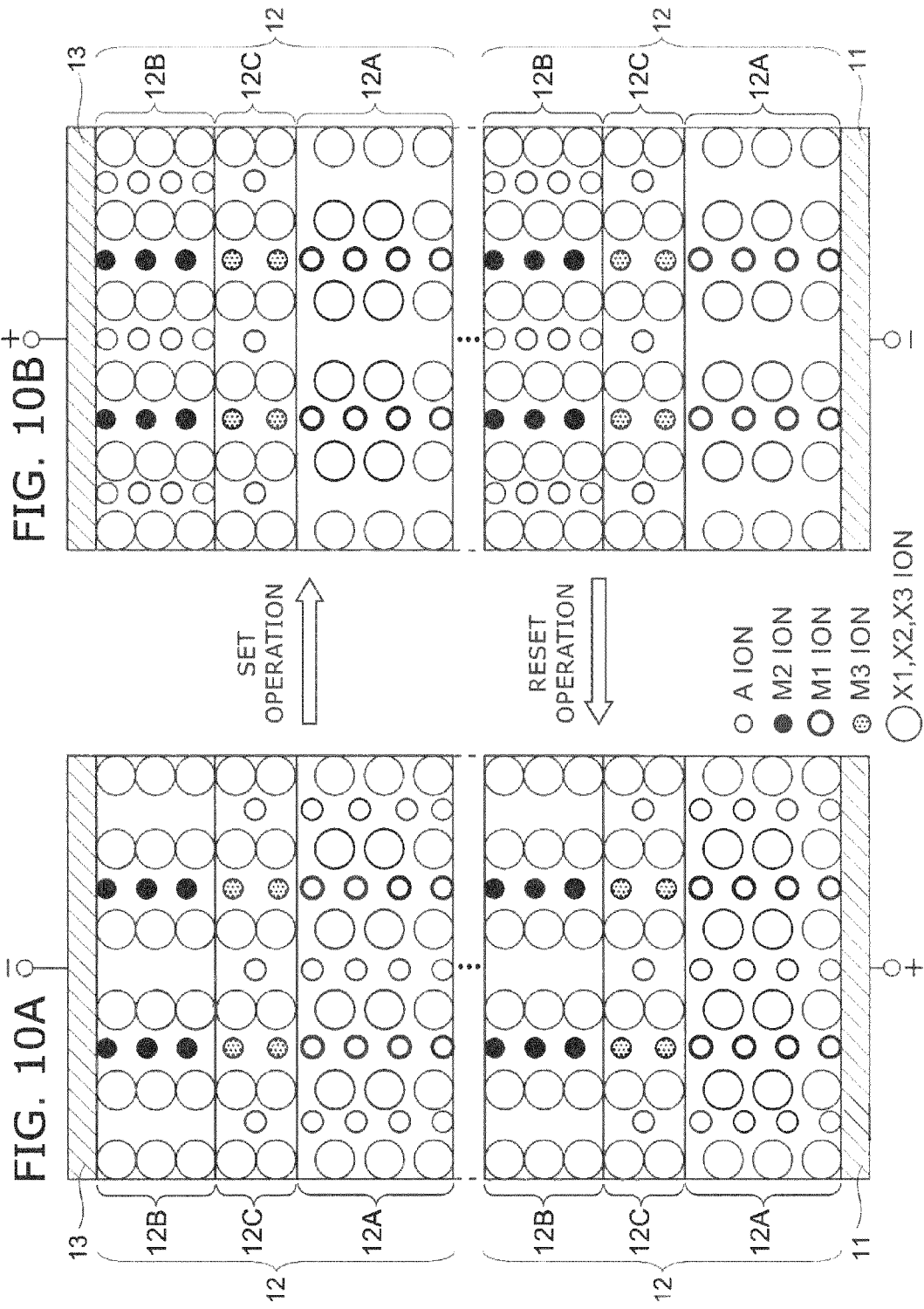

| | Material of recording layer | Crystal structure of recording layer | Material of storing layer | Crystal structure of storing layer | Material of insulating layer | Crystal structure of insulating layer | Resistance at time of set (Ω) | Resistance at time of reset (Ω) |
|---|---|---|---|---|---|---|---|---|
| 1st experimental example | $Zn_{1.1}Mn_{1.9}O_4$ | Spinel structure | $TiO_2$ | Ramsdellite structure | $ZnAl_2O_4$ | Spinel structure | 1.00E+04 | 1.00E+07 |
| 2nd experimental example | $ZnCo_2O_4$ | Spinel structure | $TiO_2$ | Ramsdellite structure | $ZnAl_2O_4$ | Spinel structure | 1.00E+04 | 1.00E+07 |
| 3rd experimental example | $ZnMn_2O_4$ | Spinel structure | $TiO_2$ | Ramsdellite structure | $Zn_2TiO_4$ | Spinel structure | 1.00E+05 | 1.00E+07 |
| 4th experimental example | $ZnCo_2O_4$ | Spinel structure | $ZrO_2$ | Fluorite structure | $Zn_2SnO_4$ | Spinel structure | 1.00E+04 | 1.00E+07 |
| 5th experimental example | $ZnMoO_3$ | Ilmenite structure | $TiO_2$ | Rutile structure | $ZnGeO_3$ | Ilmenite structure | 1.00E+04 | 1.00E+07 |
| 6th experimental example | $ZnWO_3$ | Ilmenite structure | $ZrO_2$ | Fluorite structure | $ZnSnO_3$ | Ilmenite structure | 1.00E+04 | 1.00E+07 |
| 7th experimental example | $ZnNbN_2$ | $LiMoN_2$ structure | $NbON$ | TaON structure | $ZnGeN_2$ | $LiMoN_2$ structure | 1.00E+04 | 1.00E+07 |
| 8th experimental example | $ZnTaN_2$ | $LiMoN_2$ structure | $TaON$ | TaON structure | $ZnGeN_2$ | $LiMoN_2$ structure | 1.00E+04 | 1.00E+07 |
| 9th experimental example | $ZnMn_2O_4$ | Spinel structure | $ZrO_2$ | Fluorite structure | $ZnO$ | Zinc blende structure | 1.00E+04 | 1.00E+07 |
| 10th experimental example | $ZnCo_2O_4$ | Spinel structure | $ReO_3$ | ReO3 structure | $ZnO$ | Zinc blende structure | 1.00E+04 | 1.00E+07 |
| 11th experimental example | $NaFeO_2$ | α-NaFeO$_2$ structure | $WO_3$ | ReO3 structure | $NaAlO_2$ | α-NaFeO$_2$ structure | 1.00E+04 | 1.00E+07 |
| 12th experimental example | $NaFeO_2$ | α-NaFeO$_2$ structure | $ReO_3$ | ReO3 structure | $NaYF_4$ | Fluorite structure | 1.00E+04 | 1.00E+07 |
| 13th experimental example | $MgMn_2O_4$ | Spinel structure | $ReO_3$ | ReO3 structure | $MgAl_2O_4$ | Spinel structure | 1.00E+04 | 1.00E+07 |
| 14th experimental example | $MgMn_2O_4$ | Spinel structure | $WO_3$ | ReO3 structure | $MgO$ | | 1.00E+04 | 1.00E+07 |
| 15th experimental example | $MgMoO_3$ | Ilmenite structure | $WO_3$ | ReO3 structure | $MgSnO_3$ | Ilmenite structure | 1.00E+04 | 1.00E+07 |
| Comparative example | $Zn_{1.1}Mn_{1.9}O_4$ | Spinel structure | $TiO_2$ | Ramsdellite structure | — | — | 1.00E+02~03 | 1.00E+07 |

FIG. 34

INFORMATION RECORDING AND REPRODUCING DEVICE

CROSS-REFERENCE TO RELATED APPLICATIONS

This is a continuous application of International Application PCT/JP2008/056492, filed on Apr. 1, 2008. The entire contents of each are incorporated herein by reference.

FIELD

Embodiments described herein relate generally to an information recording and reproducing device.

BACKGROUND

Small-sized portable devices are widespread worldwide these days, and at the same time demand for small-sized and large-capacity nonvolatile memory is rapidly expanding with significant progress in high-speed information transmission network. Among such memories, in particular, NAND flash memory and small-sized HDD (hard disk drive) have made rapid progress in recording density and form a big market.

Under such a situation, some ideas of new memory that aim to greatly exceed the limit of recording density are proposed. For example, PRAM (phase-change memory) uses a material capable of having two states, an amorphous state (OFF) and a crystal state (ON), as a recording material, and uses a principle that relates the two states to two-value data "0" and "1" to record data.

In regard to writing/erasing, for example, a high-power pulse is applied to the recording material to produce the amorphous state, and a low-power pulse is applied to the recording material to produce the crystal state.

The readout is performed by passing a readout current small enough not to cause writing/erasing through the recording material and measuring the electric resistance of the recording material. The resistance value of the recording material in the amorphous state is larger than the resistance value of the recording material in the crystal state, and the ratio thereof is about $10^3$, for example.

Furthermore, also a memory is reported that uses changing the resistance by a principle different from that of the PRAM. For example, there are: a memory layer including a high resistance film and an ion source layer (JP-A 2007-80311 (Kokai)); and a variable resistance device including a conductor film and an insulator film (JP-A 2007-299436 (Kokai)). In these memories, an ion is used, and a metal element is ionized or an ionized metal element moves; thereby, the resistance value of the memory device changes. In the former, the ion source layer contains: one or more elements (metal element) selected from Ag, Cu, and Zn; and one or more elements (chalcogenide element) selected from S, Se, and Te. In the latter, as the material of the conductor film, for example, a metal film, alloy film (e.g. CuTe alloy film), metal compound film, and the like containing one or more metal elements selected from Cu, Ag, and Zn are given.

BRIEF DESCRIPTION OF THE DRAWINGS

FIGS. 1A and 1B are conceptual views for describing the operation of the recording/reproducing of information in an information recording and reproducing device (first specific example) according to an embodiment;

FIGS. 2A to 4B are conceptual views for describing the operation of recording/reproducing of information in a second specific example;

FIGS. 6A and 6B are schematic views illustrating the specific example of a recording layer having a first compound layer and a second compound layer alternately stacked;

FIGS. 7A to 9B are conceptual views for describing the operation of recording/reproducing of information in a fourth specific example;

FIGS. 10A to 10B are schematic views illustrating the specific example of the recording layer having the first compound layer, the second compound layer alternately stacked and the third compound layer;

FIG. 34 is a table illustrating examination results of the first to fifteenth experimental examples and the comparative example.

DETAILED DESCRIPTION OF THE INVENTION

Figures 5A, 5B:
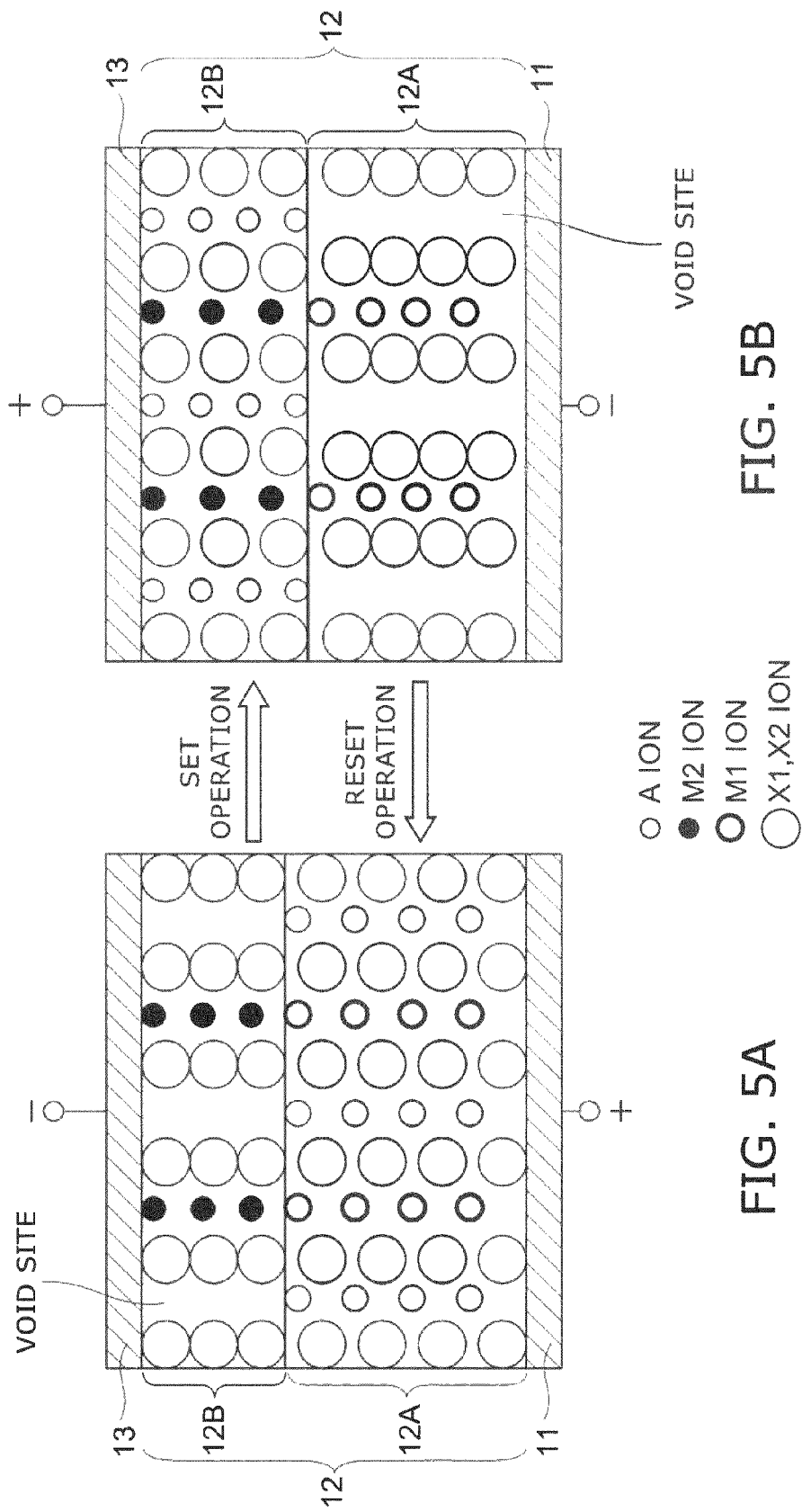
FIGS. 5A and 5B are conceptual views for describing the operation of recording/reproducing of information in a third specific example.

In general, according to one embodiment, an information recording and reproducing device includes a first layer, a second layer and a recording layer. The recording layer is provided between the first layer and the second layer and being capable of reversibly changing between a first state having a first resistance and a second state having a second resistance higher than the first resistance by a current supplied via the first layer and the second layer. The recording layer includes a first compound layer and an insulating layer. The first compound layer contains a first compound. The first compound includes a first cation element and a second cation element of a type different from the first cation element. At least one of the first cation element and the second cation element is a transition element having a d-orbital partially filled with electron. At least one of the first cation element and the second cation element is an element selected from group 1 to 4 elements and group 12 to 17 elements in a periodic table. The insulating layer contains a third compound, and the third compound includes an element selected from group 1 to 4 elements and group 12 to 17 elements in the periodic table.

Embodiments of the invention will now be described with reference to the drawings. In the drawings, like components are marked with the same reference numerals and a detailed description is omitted as appropriate.

FIGS. 1A and 1B are conceptual views for describing the operation of the recording/reproducing of information in an information recording and reproducing device (first specific example) according to an embodiment of the invention.

FIG. 1A is a cross-sectional view of a recording unit. The recording unit has a structure in which a recording layer 12 is provided between an electrode layer 11 (e.g. first layer) and an electrode layer 13 (e.g. second layer). The electrode layers 11 and 13 are provided in order to obtain an electrical connection to the recording layer 12. The electrode layers 11 and 13 may function also as a barrier layer that suppresses, for example, the diffusion of elements between the recording layer 12 and the components thereabove and therebelow, and the like. A buffer layer 10 is attached to the recording unit.

In the recording layer 12 in the recording unit illustrated in FIGS. 1A and 1B, the small open circle represents an A ion (for example, a diffusible ion), the small filled circle represents an M ion (for example, a matrix ion), the large open circle represents an X ion (for example, an anion), and the small shaded circle represents the A in a metal state.

The recording layer 12 contains oxide of a transition metal, a polymer, or a solid electrolyte that can change its resistance by voltage application. The recording layer 12 may be specifically formed of a compound containing at least two types of cation elements. In this case, the recording layer 12 contains a first compound in which at least one of the cation elements is a transition element having a d-orbital partially filled with electron, and the shortest distance between adjacent cation elements is not more than 0.32 nm. Using the recording layer 12 containing this compound enables to produce the resistance change with a relatively low power consumption. The following, for example, is given as the material of the recording layer 12 like this.

For example, the spinel structure expressed by $A_xM_yX_4$ ($0.1 \leq x \leq 2.2$, $1.5 \leq y \leq 2$) is given. A and M are elements different from each other, and at least one of them is a transition element having a d-orbital partially filled with electron. X is an element(s) including at least one selected from the group consisting of O (oxygen) and N (nitrogen).

A is at least one element selected from the group consisting of Na, K, Rb, Be, Mg, Ca, Sr, Ba, Al, Ga, Mn, Fe, Co, Ni, Cu, Zn, S, P, Se, Ge, Ag, Au, Cd, Sn, Sb, Pt, Pd, Hg, Tl, Pb, and Bi.

Furthermore, A is preferably at least one element selected from the group consisting of Mg, Mn, Fe, Co, Ni, Zn, Cd, and Hg. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from Zn, Cd, and Hg. This is because using these elements facilitates causing the movement of cation.

M is at least one element selected from the group consisting of Al, Ga, Ti, Ge, Sn, V, Cr, Mn, Fe, Co, Ni, Nb, Ta, Mo, W, Re, Ru, and Rh.

Furthermore, M is preferably at least one element selected from the group consisting of Ti, Zr, Hf, V, Nb, Ta, Cr, Mo, W, Mn, Re, Fe, Co, Ni, Al, and Ga. This is because using these elements facilitates the control of the electronic state in the crystal.

Furthermore, M is more preferably at least one transition element selected from the group (referred to as a "group 1" for convenience sake) consisting of Cr, Mo, W, Mn, and Re. This is because using these elements retains the matrix structure stably, and thereby enables to repeat switching stably.

Furthermore, M still more preferably includes at least one element selected from the group consisting of Fe, Co, Ni, Al, and Ga in addition to a transition element of the group 1 mentioned above. This is because using these elements in place of part of the elements of the group 1 retains the matrix structure more stably, and thereby enables to repeat switching more stably.

In addition to the above, for example, the delafossite structure expressed by $A_xM_yX_2$ ($0.1 \leq x \leq 1.1$, $0.9 \leq y \leq 1.1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Li, Na, Be, Mg, Ca, Cu, Ag, Au, Pt, Pd, Rh, Hg, and Tl.

Furthermore, A is preferably at least one element selected from the group consisting of Mg, Mn, Fe, Co, Ni, Cu, Ag, and Zn. This is because using these elements optimizes the ion radius for keeping the crystal structure, and can ensure a sufficient ion mobility. Furthermore, it becomes easy to control the coordination number to two.

Furthermore, A is preferably at least one element selected from the group consisting of Cu and Ag. This is because using these elements can provide the delafossite structure easily.

M is at least one element selected from the group consisting of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd.

Furthermore, M is preferably at least one element selected from the group consisting of Y, Sc, V, Cr, Mn, Fe, Co, Ni, Al, and Ga. This is because using these elements facilitates the control of the electronic state in the crystal.

Furthermore, M is still more preferably at least one element selected from the group consisting of Fe, Co, and Al. This is because using these elements can provide the delafossite structure easily.

In addition to the above, for example, the wolframite structure expressed by $A_xM_yX_4$ ($0.5 \leq x \leq 1.1$, $0.7 \leq y \leq 1.1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi.

Furthermore, A is preferably at least one element selected from the group consisting of Ti, V, Mn, Fe, Co, and Ni. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from the group consisting of Mn, Fe, Co, and Ni. This is because using these elements can produce the resistance change easily.

M is at least one element selected from the group consisting of V, Nb, Ta, Cr, Mn, Mo, and W.

Furthermore, M is preferably at least one element selected from the group consisting of Cr, Mo, and W. This is because using these elements can provide the wolframite structure easily.

In addition to the above, for example, the ilmenite structure expressed by $A_xM_yX_3$ ($0.5 \leq x \leq 1.1$, $0.9 \leq y \leq 1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Furthermore, A is preferably at least one element selected from the group consisting of Mg, Mn, Fe, Co, Ni, and Zn. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from the group consisting of Fe and Ni. This is because using these elements can provide the ilmenite structure easily.

M is at least one element selected from the group consisting of Al, Ga, Ti, Ge, Sn, V, Cr, Mn, Fe, Co, Ni, Nb, Ta, Mo, W, Re, Ru, and Rh.

Furthermore, M is preferably at least one element selected from the group consisting of Ti, Zr, Hf, V, Nb, Ta, Cr, Mn, Fe, Co, and Ni. This is because using these elements facilitates the control of the electronic state in the crystal.

Furthermore, M is preferably at least one element selected from the group consisting of Ti, Zr, Hf, and V. This is because using these elements can provide the ilmenite structure easily.

In regard to the molar ratios x and y of the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x \leq 1.1$, $0.7 \leq y \leq 1.1$), and the ilmenite structure expressed by $A_xM_yX_3$ ($0.5 \leq x \leq 1.1$, $0.9 \leq y \leq 1$), the lower limit of the numerical range is set in order to keep the crystal structure, and the upper limit thereof is set in order to control the electronic state in the crystal.

Furthermore, as described above, to cause easily the diffusion of the A ion by voltage application, a layer of the A ion element may be disposed in the direction connecting the electrodes. To this end, the c-axis of crystal is preferably disposed parallel to the film surface in the spinel structure, ilmenite structure, and delefossite structure, and the a-axis of crystal is preferably disposed parallel to the film surface in the wolframite structure.

Using a recording layer like the above as a means for a desired orientation can achieve a recording density of the Pbpsi (peta bit per square inch) class, and also can reduce power consumption.

In regard to a material having the structure described above, in FIGS. 1A and 1B, two types of cation elements are selected so that the A ion may diffuse easily in the first compound and the M ion may not diffuse in the first compound. In this case, since the M ion which does not diffuse retains the crystal structure of the first compound, the movement of the A ion can be controlled easily. Therefore, by using the first compound having such a structure, the resistance value of the recording layer 12 of the information recording and reproducing device can be changed easily.

Here, in this specification, the high resistance state is taken as a reset (initial) state, and the low resistance state is taken as a set state. However, this is for the sake of convenience, and there may be the opposite case, that is, the case where the low resistance state is the reset (initial) state and the high resistance state is the set state, depending on the selection of materials, the manufacturing method, and the like. Also such a case is included in the scope of this embodiment.

When a voltage is applied to the recording layer 12 to generate an electric potential gradient in the recording layer 12, some of the A ions move in the crystal. Accordingly, in this embodiment, the initial state of the recording layer 12 is set to an insulator (high resistance state phase), and the electric potential gradient phase-changes the recording layer 12 to provide the recording layer 12 with electrical conductivity (low resistance state phase). Thereby, the recording of information is performed.

First, for example, a state is created in which the electric potential of the electrode layer 13 is lower than the electric potential of the electrode layer 11. Assuming that the electrode layer 11 is set at a fixed potential (e.g. the ground potential), a negative potential may be applied to the electrode layer 13.

At this time, some of the A ions in the recording layer 12 move to the electrode layer 13 (cathode) side, and the number of A ions in the recording layer (crystal) 12 decreases relative to the number of X ions. The A ion having moved to the electrode layer 13 side receives an electron from the electrode layer 13 to deposit as an A atom, which is a metal, to form a metal layer 14. Therefore, in a region near the electrode layer 13, since the A ion is reduced to act like a metal, the electric resistance thereof decreases significantly.

Alternatively, in the case where the crystal structure of the recording layer 12 includes a void site that the A ion may occupy as in the case of, for example, the spinel structure, the A ion having moved to the electrode layer 13 side may occupy the void site on the electrode layer 13 side. Also in this case, to satisfy the condition of local charge neutrality, the A ion receives an electron from the electrode layer 13 to act like a metal.

In the recording layer 12, the X ion becomes surplus, and this results in increasing the valence of the A ion or the M ion left in the recording layer 12. At this time, if the A ion or the M ion is selected so that the electric resistance may decrease with the increase of the valence, the electric resistances of both the metal layer 14 and the recording layer 12 decrease due to the movement of the A ion. Therefore, the entire recording layer phase-changes into the low resistance state phase. In other words, the information recording (set operation) is completed.

The information reproducing can be performed easily by, for example, applying a voltage pulse to the recording layer 12 and detecting the resistance value of the recording layer 12. However, the amplitude of the voltage pulse is set to a value minute enough not to cause the movement of the A ion.

The process described above is a kind of electrolysis, and can be seen as a process in which an oxidizing agent is generated on the electrode layer (anode) 11 side by electrochemical oxidation, and a reducing agent is generated on the electrode layer (cathode) 13 side by electrochemical reduction.

Therefore, to turn the low resistance state phase back to the high resistance state phase, for example, the recording layer 12 may be Joule-heated by a large current pulse to accelerate the oxidation reduction reaction in the recording layer 12. That is, due to the Joule heat by the large current pulse, the A ion turns back into the crystal structure (recording layer 12) which is more stable thermally, and the initial high resistance state phase appears (reset operation).

Alternatively, the reset operation can be performed by applying a voltage pulse in the direction opposite to that during the set operation. In other words, assuming that the electrode layer 11 is set at a fixed potential (e.g. the ground potential) as at the time of the set, a positive potential may be applied to the electrode layer 13. Then, the A atom near the electrode layer 13 gives an electron to the electrode layer 13 to become the A ion, and then goes back into the crystal structure (recording layer 12) due to the electric potential gradient in the recording layer 12. Thereby, the valence of some of the A ions of which the valence has been increased decreases to the same value as in the initial state. Accordingly, a change is produced into the initial high resistance state phase.

In this operation, it is preferable that the reset operation does not occur at room temperature (a sufficiently long retention time is ensured) and further power consumption during the reset operation is sufficiently small.

The former matter can be handled by: setting the coordination number of the A ion small (ideally not more than two); setting the valence thereof not less than two; or increasing the valence of the X ion (ideally not less than three).

If the A ion is monovalent like an Li ion, a sufficient transfer resistance of ion cannot be obtained in the set state, and the A ion element immediately turns from the metal layer back into the recording layer 12. In other words, a sufficiently long retention time cannot be obtained. Furthermore, if the A ion has a valence of three or more, since the voltage necessary for the set operation is large, there is a possibility that crystal collapse is caused. Therefore, the valence of the A ion is preferably set to divalence for the information recording and reproducing device.

The latter matter can be handled by: setting the valence of the A ion not more than two in order not to cause crystal break; optimizing the ion radius of the A ion so that the A ion can move in the recording layer (crystal) 12; and using a structure in which a transfer path exists. Such elements and crystal structures as are described above may be used for the recording layer 12 of the sort.

In the case where a cation having a small coordination number is used as the A ion like the delafossite structure (in the case of the delafossite structure, the coordination number of the A ion is two), the valence of the A ion may be set to +1 to reduce the Coulomb repulsion force. This facilitates the diffusion of the A ion, and can reduce power consumption during the reset operation. Furthermore, since the coordination number is small, the state after the diffusion can be retained stably.

Next, the mixing ratio of the individual atoms will now be described.

In the case where there is a void site that the A ion may occupy, and in the case where the A ion can occupy a site that the M ion occupies originally, the mixing ratio of the A ion may be optional in some degree. Furthermore, also in the case where there is a surplus/loss of the X ion, the mixing ratio of the A ion or the M ion deviates from that of the stoichiometric composition. Therefore, the mixing ratio of the A ion or the M ion is provided with ranges. Actually, the mixing ratio of the A ion can be optimized so that the resistance of each state or the diffusion coefficient of the A ion may be an optimal value.

The lower limit of the mixing ratio of the A ion and the M ion is set so as to fabricate easily the first compound having a desired crystal structure. If the total amount of ions that occupy the sites of the M ion is too small, it is difficult to retain stably the structure at the time after the A ion is extracted.

As described above, this embodiment can facilitate the diffusion of cation by using the material described above for the recording layer 12, reduce power consumption necessary for the resistance change, and increase thermal stability. Furthermore, since the resistance change is produced by using only the diffusion of a cation element in the crystal structure, an information recording and reproducing device can be provided that can control operating characteristics easily and has a small variation in operating characteristics between cells.

The ease of the movement of ion is different between in the crystal structure and in the peripheral portion of the crystal particles. Therefore, to make recording and erasing characteristics uniform in different positions while utilizing the movement of the diffusible ion in the crystal structure, the recording layer preferably includes a polycrystalline state or single crystal state. When the recording layer is in a polycrystalline state, in view of the ease of film-formation, the size of the crystal particle in the direction of the recording film cross section preferably follows a distribution having a single peak, and the average thereof is preferably not less than 3 nm. The average of the crystal particle size is more preferably not less than 5 nm because this facilitates film-formation more, and is still more preferably not less than 10 nm because recording and erasing characteristics can be made more uniform in different positions.

Since an oxidizing agent is generated on the electrode layer (anode) 11 side after the set operation, the electrode layer 11 is preferably formed of a material difficult to oxidize (for example, electrically conductive nitride, electrically conductive oxide, etc.).

Furthermore, the electrode layer 11 is preferably formed of a material having no ion conductivity.

The following is given as such a material. Among them, $LaNiO_3$ may be selected in view of overall characteristics including a good electric conductivity and the like.

MN

M is at least one element selected from the group consisting of Ti, Zr, Hf, V, Nb, and Ta. N is nitrogen.

$MO_x$

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. The molar ratio x satisfies $1 \leq x \leq 4$.

$AMO_3$

A is at least one element selected from the group consisting of La, K, Ca, Sr, Ba, and Ln (lanthanoids).

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one element selected from the group consisting of K, Ca, Sr, Ba, and Ln (lanthanoids).

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Since a reducing agent is generated on the protection layer (cathode) 13 side after the set operation, the protection layer (electrode layer) 13 preferably has the function of suppressing reaction of the recording layer 12 with the air.

As such a material, for example, amorphous carbon, diamond-like carbon, and semiconductors such as $SnO_2$ are given.

The electrode layer 13 may function as a protection layer that protects the recording layer 12. Alternatively, a protection layer may be provided in place of the electrode layer 13. In this case, the protection layer may be either an insulator or a conductor.

Furthermore, a heater layer (a material with a resistivity of about $10^{-5}$ Ωcm or more) may be provided on the cathode side, here, on the electrode layer 13 side in order to efficiently perform the heating of the recording layer 12 during the reset operation.

Next, another example (second specific example) of the information recording and reproducing device according to the embodiment of the invention will now be described with reference to FIG. 2A to FIG. 4B.

FIGS. 2A and 2B are conceptual views for describing the operation of recording/reproducing information in the second specific example.

FIG. 2A and FIG. 2B are cross-sectional views of a recording unit. The recording unit has a structure in which the recording layer 12 is provided between the electrode layer 11 and the electrode layer 13. The recording layer 12 includes: a first compound layer 12A containing the first compound; and an third compound layer 12C (insulating layer) provided between the first compound layer 12A and the electrode layer 13.

In the recording layer 12 in the recording unit illustrated in FIGS. 2A and 2B, the small open circle represents the A ion (for example, a diffusible ion), the small filled circle represents the M ion (for example, a matrix ion), the small dotted circle represents an M3 ion (for example, a matrix ion), the large open circle represents the X ion or an X3 ion (for example, an anion), and the small shaded circle represents the A in a metal state.

The first compound layer 12A contains the first compound described above. Here, the element of the diffusible ion (A ion) which is a component of the first compound is an element selected from the group 1 to 4 elements and the group 12 to 17 elements in the periodic table. Hereinafter, the group 1 to 4 elements and the group 12 to 17 elements in the periodic table and an element selected from them are referred to as a "specific group element." The first compound is what is called a solid electrolyte which can move an ion by applying an electric field from the outside.

The third compound layer is formed of a third compound made of specific group elements. Also the third compound is a solid electrolyte which can move an ion by applying an electric field from the outside. At least one of the specific group elements in the third compound layer 12C is an element that has the same valence as the A ion element in the first compound layer 12A and an ion radius equal or close (e.g. in a range of about ±20%) to the ion radius of the A ion element. Specifically, it is the same element as the A ion element or the like.

As the material of the third compound layer 12C of the sort, a material selected from (i) AX, (ii) $AMX_2$, (iii) $AM_2X_4$, (iv) $A_2MX_4$, (v) $AMX_3$, and (vi) $AMX_4$ is given.

However, A is at least one element selected from the group consisting of Na, K, Rb, Be, Mg, Ca, Sr, Ba, Al, Ga, Zn, and Cd, and M is at least one element selected from the group consisting of B, Al, Ga, In, Si, Ge, Sn, Ti, Zr, Hf, As, Sb, Pb, Bi, Sc, Y, and Ln (lanthonoids). A and M are elements different from each other. X is at least one element selected from the group consisting of F, O, and N.

A is preferably at least one element selected from Be, Mg, Ca, Sr, Ba, Zn, and Cd, more preferably at least one element selected from Mg and Zn, and still more preferably Zn because it has crystallization acceleration effects. M is preferably at least one element selected from Al and Ga. Using these elements can provide a material having high crystallinity and high resistance to oxidation and reduction.

Furthermore, a material having a structure including at least one selected from the group consisting of the spinel structure, ilmenite structure, wolframite structure, α-$NaFeO_2$ structure, $LiMoN_2$ structure, zinc blende structure, rock salt structure, and fluorite structure may be used for the material of the third compound layer 12C.

At the time of switching, a path in the first compound layer 12A and a path in the third compound layer 12C in which the diffusible ion element moves are preferably connected continuously. Furthermore, the first compound layer 12A and the third compound layer 12C preferably have the same framework structure (crystal structure and crystal orientation).

Using the material like the above for the recording layer 12 can achieve a recording density of the Pbpsi (peta bit per square inch) class, and reduce power consumption more.

Next, the properties and functions of the third compound layer 12C will now be described.

The third compound layer 12C (the third compound 12C) is provided in order to reduce power consumption. The third compound layer 12C has the properties and functions of: (1) passing the A ion element to enable operation; (2) leaving the resistance state invariant before and after operation to enable stable operation; and (3) having a high resistivity to serve for efficient heating and reduce the ON current (current in the low resistance state). These properties of the third compound layer 12C will now be described.

First, the property of (1) of the third compound layer 12C, i.e. passing the A ion element to enable operation, will now be described.

Similarly to the information recording and reproducing device of the first specific example, also in the information recording and reproducing device of this specific example, the diffusible ion (A ion) element moves in the recording layer 12 to change the resistance state (high resistance state and low resistance state) of the recording layer 12. Thereby, various operations (switching) are performed. Specifically, at the time of, for example, the set operation, the A ion element moves to the electrode layer 13 side to form the metal layer 14, and the valence of the component element of the first compound layer 12A changes to change the resistance state of the first compound layer 12A. Thereby, the set operation is performed. Therefore, the third compound layer 12C placed between the electrode layer 13 and the first compound layer 12A is required to have the property of passing the A ion element.

This property is obtained by appropriately selecting at least one of the specific group elements contained in the third compound layer 12C. Specifically, an element (e.g. the same element as the A ion element) that has the same valence as the A ion element in the first compound layer 12A and an ion radius equal or close (e.g. in a range of about ±20%) to the ion radius of the A ion element is used as at least one of the specific group elements contained in the third compound layer 12C. Hereinafter, the specific group element in the third compound layer 12C which is appropriately selected may be referred to as a "Dc ion element" (i.e. the diffusible ion element in the third compound layer 12C).

Thereby, the Dc ion element can be diffused by electric field application similarly to the A ion element, and the A ion element derived from the first compound layer 12A and the Dc ion element derived from the third compound layer 12C can be replaced with each other. Consequently, the A ion element can pass through the third compound layer 12C during operation.

That is, as illustrated in FIGS. 2A and 2B, at the time of the set operation, the Dc ion element in the third compound layer 12C moves to the electrode layer 13 side, and the A ion elements having moved from the first compound layer 12A successively pass through the resulting space. When the set operation is completed, the third compound in the third compound layer 12C has a structure in which all or some of the Dc ion elements are replaced with the A ion elements having moved from the first compound layer 12A.

In contrast, at the time of the reset operation, as illustrated in FIGS. 2A and 2B, the diffusible ion element (A ion element or Dc ion element) in the third compound layer 12C moves to the electrode layer 11 side, and the diffusible ion elements having moved from the metal layer 14 successively pass through the resulting space. When the reset operation is completed, the third compound in the third compound layer 12C has a structure in which all or some of the diffusible ion elements having existed are replaced with the diffusible ion elements having moved from the metal layer 14.

Next, the property of (2) of the third compound layer 12C, i.e. leaving the resistance state invariant before and after operation to enable stable operation, will now be described.

In the case where the recording layer 12 formed of a plurality of layers is used, in view of ensuring good operating characteristics, it is preferable that only one layer resistance-changes (takes the role of switching) and the other layers do not resistance-change (do not take the role of switching) during the set operation and the reset operation. Alternatively, in the case where a plurality of layers resistance-change, that is, in the case where a plurality of layers contribute to switching, it is preferable that these layers resistance-change simultaneously in the same direction.

In the case where a plurality of layers can resistance-change, if only some of the layers resistance-change and the other layers do not resistance-change when an electric field is applied, the operation such as set may not be completed.

Alternatively, for example, in the case where an electric field is applied to one cell to switch it to the low resistance state and then an electric field in the opposite direction is applied to another cell adjacent to the one cell to perform the erase operation, there is a possibility that an oppositely-oriented electric field of a low voltage is applied to the one cell. In this case, only some of the layers in the one cell may resistance-change. This may result in a not-intended operating mode, that is, a false write, rewrite, or the like (these are referred to as a "disturb").

Therefore, as described below, the device is configured so that the resistance state of the third compound layer 12C may not change before and after operation and the third compound layer 12C may not contribute to switching.

In this specific example, the third compound layer 12C is formed of specific group elements. Here, the specific group elements, that is, the group 1 to 4 elements and the group 12 to 17 elements in the periodic table have the property that the valence changes relatively less easily in a solid electrolyte when ions move in and out. Therefore, the elements of the third compound layer 12C change less easily in valence. Furthermore, the diffusible ion element (A ion element) which may enter the third compound layer 12C from the outside is a specific group element, and has the same valence as the Dc ion element which is a component element of the third compound layer 12C and an equal ion radius to the Dc ion element, as described above.

Therefore, during various operations, that is, when the diffusible ion element moves, the structure (crystal state etc.) of the third compound does not change, and thereby the third compound layer 12C can retain a certain resistance state continually.

By thus configuring, the third compound layer 12C does not contribute to switching, and the switching is performed only by the first compound layer 12A. The possibility that an incomplete write, disturb, or the like occurs is reduced. Thereby, stable operation can be obtained.

Next, the property of (3) of the third compound layer 12C, i.e., having a high resistivity to serve for efficient heating and reduce the ON current (current in the low resistance state), will now be described.

As described above, the compound layer 12C is provided in order to reduce power consumption. Specifically, there are the following properties: (a) efficiently Joule-heating the recording layer 12 by the function of the third compound layer 12C during the reset operation; and (b) increasing the ON resistance value (resistance value in the low resistance state) of the recording layer 12 to reduce the ON current (current in the low resistance state). By the properties, power consumption is reduced.

First, the point of (a), efficiently Joule-heating the recording layer 12 by the function of the third compound layer 12C during the reset operation, will now be described.

First, components contributing to switching are described. To change the recording layer 12 from the high resistance state to the low resistance state, a transfer path of charge which connects the electrode layer 11 and the electrode layer 13 is formed in the recording layer 12. On the other hand, to change the recording layer 12 from the low resistance state to the high resistance state, it is sufficient to cut off this charge transfer path. For example, in the recording layer 12, it is sufficient to change only part of the principal planes into the high resistance state. In the case where the recording layer 12 is formed of a plurality of layers, it is sufficient to change only part of the layers into the high resistance state. Here, the "principal plane" is a plane perpendicular to the stack direction (vertical direction in FIGS. 2A and 2B) of the electrode layer 11, the recording layer 12, the electrode layer 13, and the like.

That is, when the switching, in particular the reset (erase) operation is performed, the resistance state of the entire recording layer 12 need not necessarily be changed, but in view of power consumption reduction, it is preferable to change the resistance state of only part of the principal planes of the recording layer 12, for example.

The above may be applied to this specific example as follows.

First, in the initial state of FIG. 2A, the whole of the first compound layer 12A is in the high resistance state. At the time of the set operation, an electric field is applied to the recording layer 12 and the diffusible ion element moves. Thereby, as illustrated in FIG. 2B, the first compound layer 12A enters the low resistance state by a similar mechanism to the first specific example. When subsequently the reset operation is performed, in view of the above discussion, it is preferable to change only part of the principal planes of the recording layer 12 into the high resistance state. Furthermore, it is preferable to heat intensively the metal layer 14 with a small film thickness to move the diffusible ion element to the electrode layer 11 side efficiently.

Accordingly, the third compound layer 12C with a high resistivity is provided between the first compound layer 12A and the electrode layer 13.

FIGS. 3A and 3B are conceptual views for describing the operation of recording/reproducing information in the second specific example. FIG. 3A and FIG. 3B are cross-sectional views of the recording unit.

The case is described where the recording unit in the set state illustrated in FIG. 3A is Joule-heated to change it into the reset state illustrated in FIG. 3B.

During the Joule heating, since the resistivity of the third compound layer 12C is high, the third compound layer 12C and the neighborhood thereof are intensively heated. Accordingly, the metal layer 14 in contact with the third compound layer 12C is heated relatively easily, and the diffusible ion element (A ion element or Dc ion element) easily moves to the electrode layer 11 side. Furthermore, since the third compound layer 12C is heated, the diffusible ion element can pass through the third compound layer 12C. Moreover, since a portion of the first compound layer 12A, that is, a region near the interface with the third compound layer 12C is heated, the diffusible ion element can move to this region. Thereby, the recording layer 12 obtains a structure in which part of the principal planes, that is, only the region of the first compound layer 12A near the interface with the third compound layer 12C is in the high resistance state.

Consequently, the recording layer 12 is efficiently switched to the high resistance state, and the reset operation is completed as illustrated in FIG. 3B.

The third compound layer 12C has a higher resistivity than the first compound layer 12A in the low resistance state (ON state). For example, it may be $10^3$ Ωcm or more.

Here, although the resistivity of the third compound layer 12C is high, the resistance value of the third compound layer 12C can be made an arbitrary value by appropriately adjusting the film thickness of the third compound layer 12C. In this case, it is conceivable that mostly the tunnel resistance accounts for the electric resistance of the third compound layer 12C. Thereby, the recording layer 12 can be switched to the low resistance state (ON state) and an appropriate resistance value can be ensured in the ON state, which enables efficient heating.

The third compound layer 12C preferably has a film thickness of, for example, 10 nm or less.

Next, the case where the set operation is again performed will now be described.

FIGS. 4A and 4B are conceptual views for describing the operation of recording/reproducing information in the second specific example. FIG. 4A and FIG. 4B are cross-sectional views of the recording unit.

The case is described where an electric field is applied to the recording unit in the reset state illustrated in FIG. 4A to change it into the set state illustrated in FIG. 4B.

When an electric field is applied so that the electrode layer 13 side may become a cathode as illustrated in FIG. 4A, the diffusible ion element (A ion element or Dc ion element) existing in the third compound layer 12C moves to the electrode layer 13 side to deposit in the metal layer 14. Further, also the diffusible ion element existing in a portion of the first compound layer 12A near the interface with the third compound layer 12C moves to the electrode layer 13 side. Thereby, the entire region of the first compound layer 12A enters the low resistance state.

Consequently, the recording layer 12 enters the low resistance state, and the set operation is completed as illustrated in FIG. 4B.

As described above, by providing the third compound layer 12C having a high resistivity between the first compound 12A and the electrode layer 13, the recording layer 12 is efficiently Joule-heated during the reset operation, and thereby power consumption is reduced.

In regard to components contributing to switching, whereas all the diffusible ion elements contribute to switching in the first operation (set operation), only diffusible ion elements in and near the third compound layer 12C contribute to switching in the second and subsequent operations (reset operation and set operation). The information recording and reproducing device according to this specific example performs switching by moving efficiently only minimum components, and reduces power consumption.

Next, the point of (b), increasing the ON resistance value (resistance value in the low resistance state) of the recording layer 12 to reduce the ON current (current in the low resistance state), will now be described.

By providing the third compound layer 12C having an appropriate resistance value in the recording layer 12, the resistance value of the recording layer 12 in the ON state (low resistance state) increases. Accordingly, in the ON state, the current flowing through the recording layer 12 decreases. Thereby, power consumption is reduced.

Thus far, to control the resistance value (ON resistance value) in the ON state to a desired value, a method of controlling the switching current or a method of controlling the pulse width has been used. However, these methods have limitations on increasing the ON resistance value. According to this specific example, the third compound layer 12C is provided having a constant resistivity both in the ON state (selective state) and the OFF state (non-selective state), and thereby the ON resistance value can be set to a desired value more easily.

Thus, according to this specific example, by providing the high-resistivity third compound layer 12C having an appropriate film thickness, the ON resistance value can be set to an appropriate value to efficiently Joule-heat the recording layer 12 during the reset operation, without inhibiting switching. Thereby, power consumption is reduced. Furthermore, the resistance of the recording layer 12 in the ON state increases to reduce the ON current. Thereby, various operations can be performed with very low power consumption per cell.

Next, still another specific example (third specific example) of the recording layer 12 will now be described with reference to FIGS. 5A and 5B and FIGS. 6A and 6B.

FIGS. 5A and 5B are conceptual views for describing the operation of recording/reproducing information in the third specific example.

Also this recording unit has a structure in which the recording layer 12 is provided between the electrode layers 11 and 13.

The recording layer 12 includes: the first compound layer 12A disposed on the electrode layer 11 side and containing the first compound expressed by $A_xM1_yX1_z$; and a second compound layer 12B disposed on the electrode layer 13 side, containing at least one type of transition element, and including a void site capable of storing the A ion element of the first compound layer 12A.

In the first compound layer 12A in the recording unit illustrated in FIGS. 5A and 5B, the small open circle represents the A ion (for example, a diffusible ion), the small thick open circle represents an M1 ion (for example, a matrix ion), and the large open circle represents an X1 ion (for example, an anion). In the second compound layer 12B in the recording unit illustrated in FIGS. 5A and 5B, the small filled circle represents an M2 ion (for example, a matrix ion), and the large open circle represents an X2 ion (for example, an anion).

Compounds expressed by, for example, the following chemical formulae are given as the second compound layer 12B, where the void site in which the A ion may be stored is represented by "Φ". Some of the void sites may be occupied by other ions in advance in order to facilitate the film-formation of the second compound layer 12B.

$\Phi_x M2X2_2$

M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I. The molar ratio x satisfies $0.3 \leq x \leq 1$.

$\Phi_x M2X2_3$

M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I. The molar ratio x satisfies $1 \leq x \leq 2$.

$\Phi_x M2X2_4$

M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I. The molar ratio x satisfies $1 \leq x \leq 2$.

$\Phi_x M2PO_z$

M2 is at least one element selected from the group consisting of Ti, Ge, Sn, V, Cr, Mn, Fe, Co, Ni, Nb, Ta, Mo, W, Re, Ru, and Rh.

P is phosphorus, and O is oxygen. The molar ratios x and z satisfy $0.3 \leq x \leq 3$, and $4 \leq z \leq 6$.

$\Phi_x M2O_5$

M2 is at least one element selected from the group consisting of V, Cr, Mn, Fe, Co, Ni, Nb, Ta, Mo, W, Re, Ru, and Rh.

O is oxygen. The molar ratio x satisfies $0.3 \leq x \leq 2$.

The second compound preferably has a structure including at least one selected from the group consisting of the hollandite structure, ramsdellite structure, anatase structure, brookite structure, pyrolusite structure, $ReO_3$ structure, $MoO_{1.5}PO_4$ structure, $TiO_{0.5}PO_4$ structure, $FePO_4$ structure, $\beta MnO_2$ structure, $\gamma MnO_2$ structure, $\lambda MnO_2$ structure, spinel structure, and ilmenite structure. For example, the second compound may have the ilmenite structure which is the same structure as the first compound.

The Fermi level of the electrons of the first compound layer 12A is set lower than the Fermi level of the electrons of the second compound layer 12B. This is one of the desired conditions for providing the state of the recording layer 12 with reversibility. Here, the Fermi levels are values measured from the vacuum level.

Thus, the second compound layer 12B containing the second compound including the void site that stores the A ion of the first compound layer 12A is provided in contact with the first compound layer 12A. Thereby, the diffused A ion element can exist stably with ease. By using such a combination of materials for the recording layer to facilitate the transfer of ion between the first compound layer 12A and the second compound layer 12B, power consumption necessary for the resistance change can be reduced and thermal stability can be increased. Furthermore, using such a combination of materials for the recording layer can achieve a recording density of the Pbpsi (peta bit per square inch) class, and reduce power consumption.

As illustrated in FIGS. 6A and 6B, the first compound layer 12A and the second compound layer 12B included in the recording layer 12 may be alternately stacked in plural.

In the recording unit like this, when electric potentials are applied to the electrode layers 11 and 13 to generate an electric potential gradient in the recording layer 12 so that the first compound layer 12A becomes the anode side and the second compound layer 12B becomes the cathode side, some of the A ion elements in the first compound layer 12A containing the first compound move in the crystal to enter the second compound layer 12B on the cathode side.

Since there is the void site for the A ion in the crystal of the second compound layer 12B, the A ion having moved from the first compound layer 12A containing the first compound is stored in the void site.

Therefore, the valence of some of the A ions or the M2 ions decreases in the second compound layer 12B, and the valence of the A ion or the M1 ion increases in the first compound layer 12A. Therefore, a transition element having a d-orbital partially filled with electron is used as at least one of the A ion and the M1 ion, so that the valence thereof can change easily.

In other words, assuming that, in the initial state (reset state), the first compound layer 12A and the second compound layer 12B are in the high resistance state (insulator), some of the A ions in the first compound layer 12A move into the second compound layer 12B to produce electrically-conductive carriers in the crystals of the first compound layer 12A and the second compound layer 12B, and both are provided with electrical conductivity.

Thus, since the electric resistance value of the recording layer 12 becomes small by applying a current/voltage pulse to the recording layer 12, the set operation (recording) is performed.

At this time, also electrons move from the first compound layer 12A toward the second compound layer 12B simultaneously. Since the Fermi level of the electrons of the second compound layer 12B is higher than the Fermi level of the electrons of the first compound layer 12A, the total energy of the recording layer 12 increases.

Furthermore, since such a high energy state continues after the set operation is completed, the recording layer 12 may naturally turn from the set state (low resistance state) back to the reset state (high resistance state).

However, using the recording layer 12 according to the example of this embodiment eliminates such a concern. That is, the set state can be kept.

This is because what is called the ion transfer resistance is in effect. As described above, it is preferable for the information recording and reproducing device to set the coordination number of the A ion small (e.g. not more than two), or to set the valence thereof to divalence.

Since an oxidizing agent is generated on the anode side after the set operation is completed, also in this case, a material difficult to oxidize and having no ion conductivity (for example, electrically conductive oxide) is preferably used as the electrode layer 11. Suitable examples thereof are as described above.

The reset operation (erasing) may be performed by heating the recording layer 12 to accelerate a phenomenon in which the A ion stored in the void site of the second compound layer 12B described above goes back into the first compound layer 12A.

Specifically, the Joule heat generated by applying a large current pulse to the recording layer 12 and the residual heat thereof may be used. Thereby, the recording layer 12 can be easily turned back to the high resistance state (insulator).

Since the recording layer 12 is low resistive, a large current flows even if the electric potential difference is small.

Thus, the electric resistance value of the recording layer 12 becomes large by applying a large current pulse to the recording layer 12. Thereby, the reset operation (erasing) is performed. Alternatively, the reset operation can be performed also by applying an electric field in the direction opposite to that in the set operation.

Here, to achieve low power consumption, it is important to optimize the ion radius of the A ion and use a structure in which a transfer path exists so that the A ion can move in the crystal without causing crystal break.

Using a material and crystal structure like those described above for the second compound can meet such conditions, and is effective in achieving low power consumption.

Furthermore, the movement of the A ion is easily caused in a compound layer containing a compound of one of the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x = 1.1$, $0.7 \leq y \leq 1.1$), and the ilmenite structure expressed by $A_xM_yX_3$ ($0.5 \leq x \leq 1.1$, $0.9 \leq y \leq 1$), which has a structure like the recording unit illustrated in FIGS. 1A and 1B. Therefore, compounds having these structures are suitably used as the first compound.

In particular, the first compound layer 12A is preferably oriented so that the transfer path may be disposed in the direction connecting the electrodes, because this facilitates the movement of the A ion in the first compound layer 12A. Furthermore, the first compound and the second compound preferably have the same lattice constant, because the orientation can be controlled easily to perform film-formation even in the case where a material that includes the void site and is difficult to film-form is used.

Next, a suitable range of the film thickness of the second compound layer 12B will now be described.

To store the A ion in the void site, the second compound layer 12B preferably has a film thickness of 1 nm or more.

On the other hand, if the number of void sites of the second compound layer 12B is larger than the number of ions in the first compound layer 12A, the resistance change of the second compound 12B is small. Therefore, the number of void sites in the second compound layer 12B is preferably equal to or smaller than the number of A ions in the first compound layer 12A in the same cross-sectional area.

Since the density of the A ion in the first compound layer 12A and the density of the void site in the second compound layer 12B are almost the same, the second compound layer 12B preferably has a film thickness equal to or smaller than the film thickness of the first compound layer 12A.

Generally, a heater layer (a material with a resistivity of about $10^{-5}$ Ωcm or more) for further accelerating the reset operation may be provided on the cathode side.

In a probe memory, since a reducing material deposits on the cathode side, a surface protection layer is preferably provided in order to prevent reaction with the air.

The heater layer and the surface protection layer may be formed of one material having both functions. For example, amorphous carbon, diamond-like carbon, and semiconductors such as $SnO_2$ have both a heater function and a surface protection function.

The reproducing can be performed easily by passing a current pulse through the recording layer 12 and detecting the resistance value of the recording layer 12.

However, the current pulse is set to a value minute enough not to cause the resistance change in the material of the recording layer 12.

Next, still another specific example (fourth specific example) of the recording layer 12 will now be described with reference to FIG. 7A to FIG. 10B.

FIGS. 7A and 7B are conceptual views for describing the operation of recording/reproducing of information in the fourth specific example.

FIG. 7A and FIG. 7B are cross-sectional views of the recording unit. This recording unit has a structure in which the recording layer 12 is provided between the electrode layer 11 and the electrode layer 13. The recording layer 12 includes: the first compound layer 12A containing the first compound; the second compound layer 12B containing the second compound; and the third compound layer 12C provided between the first compound layer 12A and the second compound layer 12B.

In the first compound layer 12A in the recording unit illustrated in FIGS. 7A and 7B, the small open circle represents the A ion (for example, a diffusible ion), the small thick open circle represents the M1 ion (for example, a matrix ion), and the large open circle represents the X1 ion (for example, an anion). In the second compound layer 12B, the small filled circle represents the M2 ion (for example, a matrix ion), and the large open circle represents the X2 ion (for example, an anion). In the third compound layer 12C, the small open circle represents the A ion (for example, a diffusible ion), the small dotted circle represents the M3 ion (for example, a matrix ion), and the large open circle represents the X3 ion (for example, an anion).

The first compound layer 12A and the third compound layer 12C are similar to those described above in regard to the second specific example. That is, both contain the A ion element and the Dc ion element which are the diffusible ion element made of a specific group element. The Dc ion element is an element (e.g. the same element as the A ion element) that has the same valence as the A ion element and an ion radius equal or close (e.g. in a range of about ±20%) to the ion radius of the A ion element. The second compound layer 12B is similar to that described above in regard to the third specific example.

At the time of switching, the path in the first compound layer 12A, the path in the third compound layer 12C, and the path in the second compound layer 12B in which the diffusible ion element moves are preferably connected continuously. Furthermore, the first compound layer 12A, the third compound layer 12C, and the second compound layer 12B preferably have the same framework structure (crystal structure and crystal orientation).

Using the material like the above for the recording layer 12 can achieve a recording density of the Pbpsi (peta bit per square inch) class and still lower power consumption.

As illustrated in FIGS. 10A and 10B, the first compound layer 12A, the second compound layer 12B, and the third compound layer 12C included in the recording layer 12 may be alternately stacked in plural.

Next, the properties and functions of the third compound layer 12C will now be described.

The third compound layer 12C is provided in order to reduce power consumption similarly to the second specific example. The third compound layer 12C has the properties and functions of (1) passing the A ion element to enable operation, (2) leaving the resistance state invariant before and after operation to enable stable operation, and (3) having a high resistivity to serve for efficient heating and reduce the ON current (current in the low resistance state). These properties of the third compound layer 12C will now be described.

First, the property of (1) of the third compound layer 12C, i.e. passing the A ion element to enable operation, will now be described.

Similarly to the information recording and reproducing devices of the first to third specific examples, also in the information recording and reproducing device of this specific example, the diffusible ion element moves in the recording layer 12 to change the resistance state (high resistance state and low resistance state) of the recording layer 12. Thereby, various operations (switching) are performed. Specifically, at the time of, for example, the set operation, the A ion element moves to the electrode layer 13 side to be stored in the second compound layer 12B, and the valence of some of the component elements of the first compound layer 12A and the second compound layer 12B changes to change the resistance states of the first compound layer 12A and the second compound layer 12B. Thereby, the set operation is performed. Accordingly, the third compound layer 12C placed between the first compound layer 12A and the second compound layer 12B is required to have the property of passing the A ion element.

This issue is resolved by appropriately selecting at least one of the specific group elements contained in the third compound layer 12C. Here, as described above, the third compound layer 12C contains the Dc ion element. As described in regard to the second specific example, the Dc ion element can diffuse by electric field application, and can be mutually replaced with the A ion element. Furthermore, the second compound layer 12B having the void site is in contact with the interface of the third compound layer 12C on the side opposite to the first compound layer 12A (the electrode layer 13 side). Consequently, the A ion element can pass through the third compound layer 12C during operation.

That is, as illustrated in FIGS. 7A and 7B, at the time of the set operation, the Dc ion element in the third compound layer 12C moves to the electrode layer 13 side to be stored in the void site in the second compound layer 12B, and the A ion elements having moved from the first compound layer 12A successively pass through the resulting space in the third compound layer 12C. When the set operation is completed, the third compound has a structure in which all or some of the Dc ion elements are replaced with the A ion elements.

In contrast, at the time of the reset operation, as illustrated in FIGS. 7A and 7B, the diffusible ion element (A ion element or Dc ion element) in the third compound layer 12C moves to the electrode layer 11 side, and the diffusible ion elements having moved from the second compound layer 12B successively pass through the resulting space in the third compound layer 12C. When the reset operation is completed, the third compound has a structure in which all or some of the diffusible ion elements having existed are replaced with the diffusible ion elements having moved from the second compound layer 12B.

Next, the property of (2) of the third compound layer 12C, i.e. leaving the resistance state invariant before and after operation to enable stable operation, will now be described.

As described above in regard to the second specific example, in the case where the recording layer 12 formed of a plurality of layers is used, in view of ensuring good operating characteristics, it is preferable that only one layer resistance-changes (takes the role of switching) and the other layers do not resistance-change (do not take the role of switching) during the set operation and reset operation. Alternatively, in the case where a plurality of layers resistance-change, that is, in the case where a plurality of layers contribute to switching, these layers preferably resistance-change simultaneously in the same direction.

Therefore, as described below, the device is configured so that the resistance state of the third compound layer 12C may not change before and after operation and the third compound layer 12C may not contribute to switching.

In this specific example, the third compound layer 12C is formed of specific group elements of which the valence changes relatively less easily in a solid electrolyte when ions move in and out. Furthermore, the diffusible ion element (A ion element) which may enter the third compound layer 12C from the outside is a specific group element, and has the same valence as the Dc ion element which is a component element of the third compound layer 12C and an equal ion radius to the Dc ion element.

Therefore, during various operations, that is, when the diffusible ion element moves, the structure (crystal state etc.) of the third compound layer 12C does not change, and thereby the third compound layer 12C can retain a certain resistance state continually.

By thus configuring, the third compound layer 12C does not contribute to switching, and the switching is performed only by the first compound layer 12A and the second compound layer 12B. The possibility that an incomplete write, disturb, or the like occurs is reduced. Thereby, stable operation can be obtained.

Next, the property of (3) of the third compound layer 12C, i.e., having a high resistivity to serve for efficient heating and reduce the ON current (current in the low resistance state), will now be described.

As described above, the third compound layer 12C is provided in order to reduce power consumption. Specifically, there are the following properties: (a) efficiently Joule-heating the recording layer 12 by the function of the third compound layer 12C during the reset operation; and (b) increasing the ON resistance value (resistance value in the low resistance state) of the recording layer 12 to reduce the ON current (current in the low resistance state). By the properties, power consumption is reduced.

First, the point of (a), efficiently Joule-heating the recording layer 12 by the function of the third compound layer 12C during the reset operation, will now be described.

As described above in regard to the second specific example, in regard to components contributing to switching, when the switching, in particular the reset (erase) operation is performed, the resistance state of the entire recording layer 12 need not necessarily be changed, but in view of power consumption reduction, it is preferable to change the resistance state of only part of the principal planes of the recording layer 12, for example.

The above may be applied to this specific example as follows.

In the initial state of FIG. 7A, all of the first compound layer 12A and the second compound layer 12B are in the high resistance state. At the time of the set operation, an electric field is applied to the recording layer 12 and the diffusible ion element moves. Thereby, as illustrated in FIG. 7B, both the first compound layer 12A and the second compound layer 12B enter the low resistance state by a similar mechanism to the third specific example. When subsequently the reset operation is performed, in view of the above discussion, it is preferable to change only part of the principal planes of the recording layer 12 into the high resistance state.

Therefore, the third compound layer 12C with a high resistivity is provided between the first compound layer 12A and the second compound layer 12B.

FIGS. 8A and 8B are conceptual views for describing the operation of recording/reproducing information in the fourth specific example. FIG. 8A and FIG. 8B are cross-sectional views of the recording unit.

The case is described where the recording unit in the set state illustrated in FIG. 8A is Joule-heated to change it into the reset state illustrated in FIG. 8B.

During the Joule heating, since the resistivity of the third compound layer 12C is high, the third compound layer 12C and the neighborhood thereof are intensively heated. That is, the third compound layer 12C, and regions (neighborhood regions) of the first compound layer 12A and the second compound layer 12B in contact with the third compound layer 12C are intensively heated. Thereby, the diffusible ion element (A ion element or Dc ion element) in the third compound layer 12C can move to the region of the first compound layer 12A near the third compound layer 12C on the electrode layer 11 side. Furthermore, the diffusible ion elements in the region of the second compound layer 12B near the third compound layer 12C can successively pass through the resulting space in the third compound layer 12C. Thereby, the recording layer 12 obtains a structure in which part of the principal planes, that is, only the regions of the first compound layer 12A and the second compound layer 12B near the third compound layer 12C are in the high resistance state.

Consequently, the recording layer 12 is efficiently switched to the high resistance state, and the reset operation is completed as illustrated in FIG. 8B.

The third compound layer 12C) has a higher resistivity than the first compound layer 12A and the second compound layer 12B in the lower resistance state (ON state). For example, it may be $10^3$ Ωcm or more.

Here, although the resistivity of the third compound layer 12C is high, the resistance value of the third compound layer 12C can be made an arbitrary value by controlling the film thickness of the third compound layer 12C. In this case, it is conceivable that mostly the tunnel resistance accounts for the electric resistance of the third compound layer 12C. Thereby, the recording layer 12 can be switched to the low resistance state (ON state), and an appropriate resistance value can be ensured in the ON state, which enables efficient heating.

Preferable film thicknesses of the third compound layer 12C are as described above in regard to the second specific example.

Next, the case where the set operation is again performed will now be described.

FIGS. 9A and 9B are conceptual views for describing the operation of recording/reproducing information in the fourth specific example. FIG. 9A and FIG. 9B are cross-sectional views of the recording unit.

The case is described where an electric field is applied to the recording unit in the reset state illustrated in FIG. 9A to change it into the set state illustrated in FIG. 9B.

When an electric field is applied so that the electrode layer 13 side may become a cathode as illustrated in FIG. 9A, the diffusible ion element (A ion element or Dc ion element) existing in the third compound layer 12C moves to the region of the second compound layer 12B near the third compound layer 12C on the electrode layer 13 side. Further, the diffusible ion elements in the region of the first compound layer 12A near the third compound layer 12C successively pass through the resulting space in the third compound layer 12C to move to the electrode layer 13 side. Thereby, the entire regions of the first compound layer 12A and the second compound layer 12B enter the low resistance state.

Consequently, the recording layer 12 enters the low resistance state, and the set operation is completed as illustrated in FIG. 9B.

As described above, by providing the third compound layer 12C having a high resistivity between the first compound layer 12A and the second compound layer 12B, the recording layer 12 is efficiently Joule-heated during the reset operation, and thereby power consumption is reduced.

In regard to components contributing to switching, whereas all the diffusible ion elements contribute to switching in the first operation (set operation), only diffusible ion elements in and near the third compound layer 12C contribute to switching in the second and subsequent operations (reset operation and set operation). The information recording and reproducing device according to this specific example performs switching by moving efficiently only minimum components, and thereby reduces power consumption.

Next, the point of (b), increasing the ON resistance value (resistance value in the low resistance state) of the recording layer 12 to reduce the ON current (current in the low resistance state), will now be described.

By providing the third compound layer 12C having an appropriate resistance value in the recording layer 12, the resistance value of the recording layer 12 in the ON state (low resistance state) increases. Therefore, in the ON state, the current flowing through the recording layer 12 decreases. Thereby, power consumption is reduced.

Thus far, to control the resistance value (ON resistance value) in the ON state to a desired value, a method of controlling the switching current or a method of controlling the pulse width is used. However, these methods have limitations on increasing the ON resistance value. According to this specific example, by providing the third compound layer 12C) having a constant resistivity both in the ON state (selective state) and the OFF state (non-selective state), the ON resistance value can be set to a desired value more easily.

Thus, according to this specific example, by providing the high-resistivity third compound layer 12C having an appropriate film thickness, the ON resistance value can be set to an appropriate value to efficiently Joule-heat the recording layer 12 during the reset operation, without inhibiting switching. Thereby, power consumption is reduced. Furthermore, the resistance of the recording layer 12 in the ON state increases to reduce the ON current. Thereby, various operations can be performed with very low power consumption per cell.

Application examples of the information recording and reproducing device according to this embodiment will now be described.

Three cases will be described: the case where the recording unit according to this embodiment is used for a probe memory; the case where it is used for a semiconductor memory; and the case where it is used for a flash memory.

Probe Memory

Figure 11:
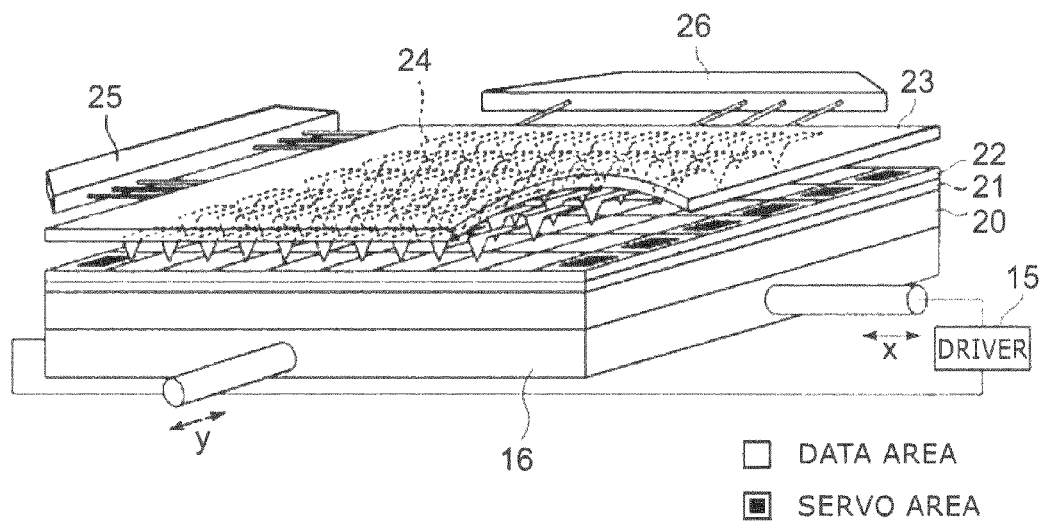
FIG. 11 and FIG. 12 are schematic views illustrating a probe memory according to the embodiment.
Figure 12:
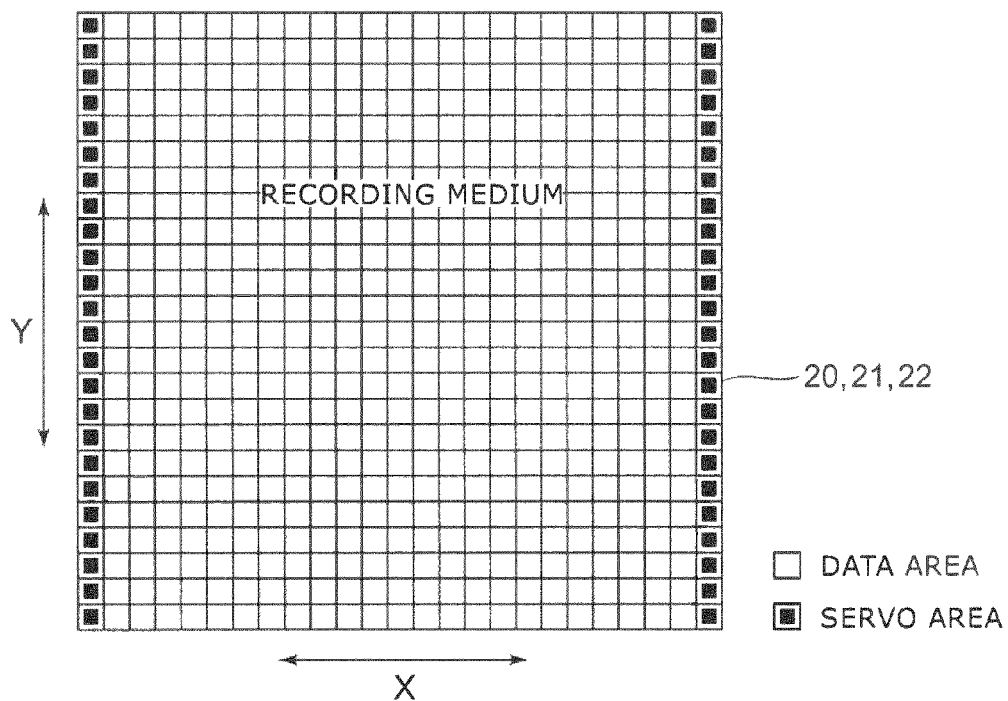

FIG. 11 and FIG. 12 are schematic views illustrating a probe memory according to this embodiment.

A recording medium in which the recording unit of this embodiment is provided is disposed on an XY scanner 16. A probe array is disposed opposite to the recording medium.

The probe array includes: a substrate 23; and a plurality of probes (heads) 24 disposed in an array form on one side of the substrate 23. Each of the plurality of probes 24 is formed of, for example, a cantilever, and is driven by multiplex drivers 25 and 26.

The plurality of probes 24 can be operated individually by using a micro actuator in the substrate 23. Here, an example is described in which all the probes 24 are collectively caused to perform the same operation to access the data areas of the recording medium.

First, all the probes 24 are reciprocated in the X direction with a constant period by using the multiplex drivers 25 and 26 to read out the positional information in the Y direction from servo areas of the recording medium. The positional information in the Y direction is transmitted to a driver 15.

The driver 15 drives the XY scanner 16 based on the positional information to move the recording medium in the Y direction to perform the positioning of the recording medium and the probes.

When the positioning of both is completed, the readout or writing of data is performed for all the probes 24 on/above the data areas simultaneously and continuously.

Since the probes 24 reciprocate in the X direction, the readout and writing of data are continuously performed. The readout and writing of data are performed one line at a time for the data areas by successively changing the position in the Y direction of the recording medium.

It is also possible to reciprocate the recording medium in the X direction with a constant period to read out the positional information from the recording medium and to move the probes 24 in the Y direction.

The recording medium is formed of, for example, a substrate 20, an electrode layer 21 on the substrate 20, and a recording layer 22 on the electrode layer 21.

The recording layer 22 includes: the plurality of data areas; and the servo areas disposed on both sides in the X direction of the plurality of data areas. The plurality of data areas occupy the main part of the recording layer 22.

A servo burst signal is recorded in the servo area. The servo burst signal indicates the positional information in the Y direction in the data areas.

In addition to the areas for the above information, an address area in which address data are recorded and a preamble area for synchronizing are disposed in the recording layer 22.

The data and the servo burst signal are recorded in the recording layer 22 as a recording bit (electric resistance variation). The "1" and "0" data of the recording bit are read out by detecting the electric resistance of the recording layer 22.

In this example, one probe (head) is provided for one data area, and one probe is provided for one servo area.

The data area is formed of a plurality of tracks. The track of the data area is identified through an address signal read out from the address area. The servo burst signal read out from the servo area is a signal for moving the probe 24 to the center of the track to eliminate read errors of the recording bit.

Here, the head position control technology of HDD can be utilized by relating the X direction to the down track direction and the Y direction to the track direction.

Next, the recording/reproducing operation of the probe memory will now be described.

Figure 13:
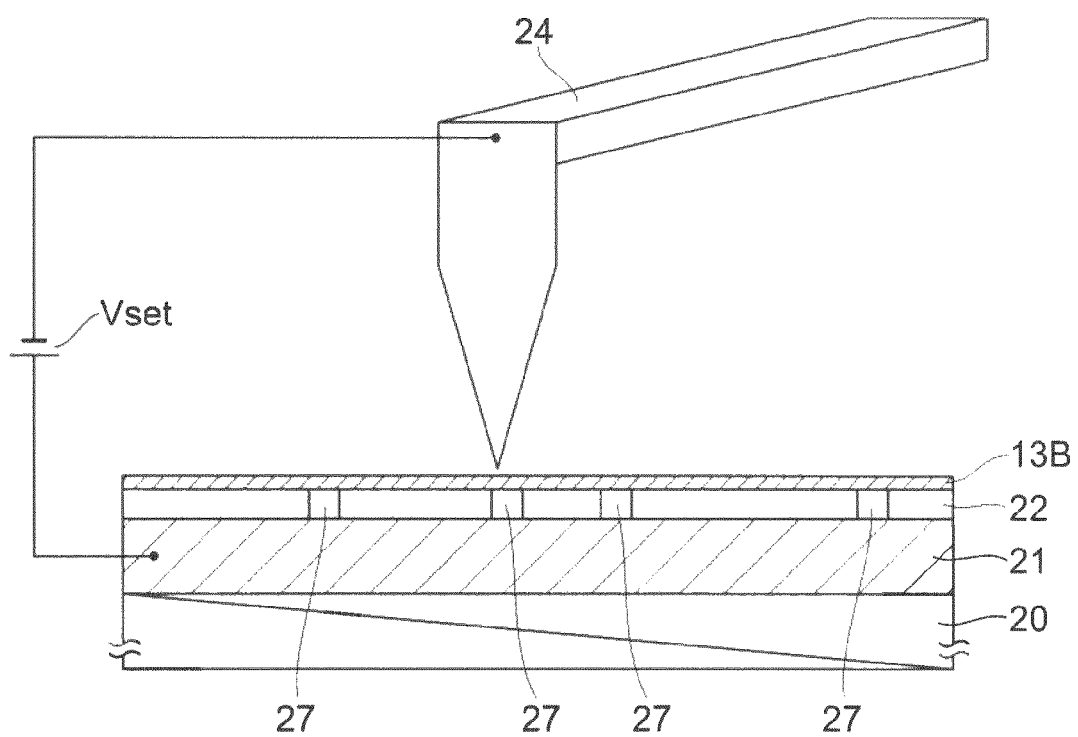
FIG. 13 is a conceptual view for describing the state at the time of recording (set operation) in the probe memory according to the embodiment.

FIG. 13 is a conceptual view for describing the state at the time of recording (set operation).

The recording medium is formed of: the electrode layer on the substrate (e.g. a semiconductor chip) 20; the recording layer 22 on the electrode layer 21; and a protection layer 13B on the recording layer 22. The protection layer 13B is formed of, for example, a thin insulator.

The recording operation is performed by applying a voltage to the surface of a recording bit 27 of the recording layer 22 to generate an electric potential gradient in the recording bit 27. Specifically, a current/voltage pulse may be applied to the recording bit 27.

Figure 14:
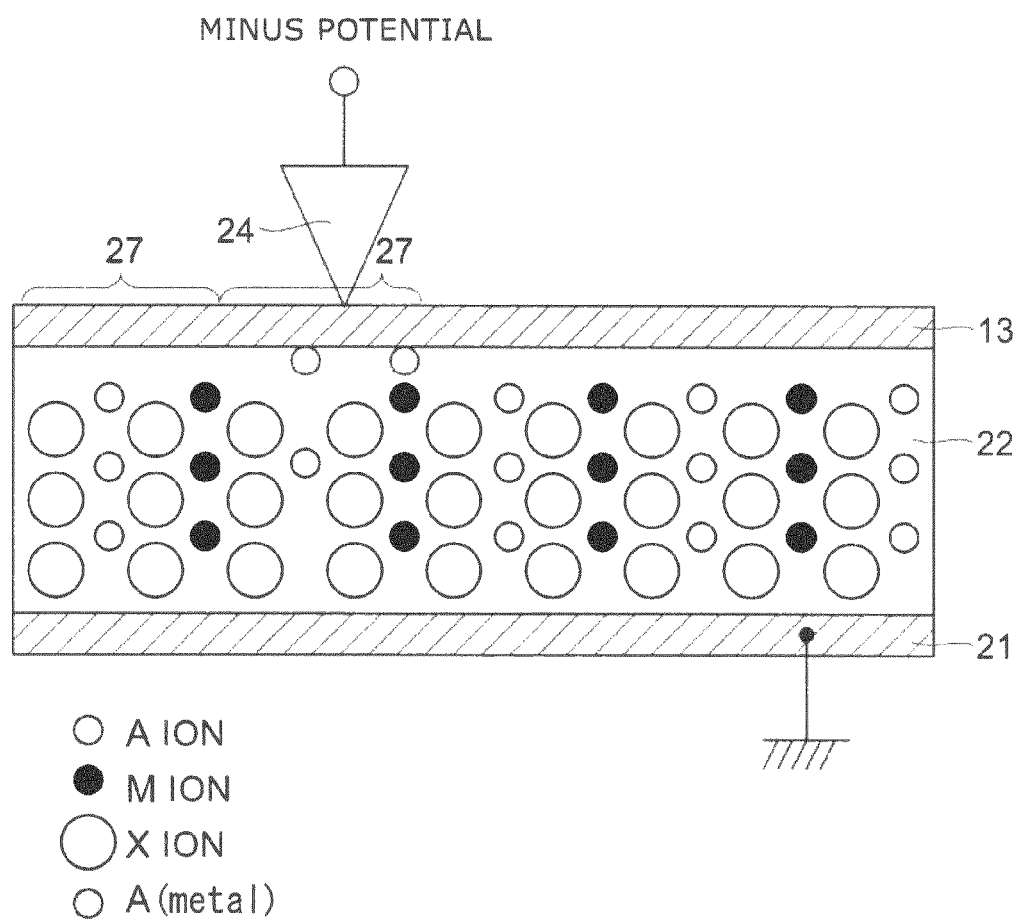
FIG. 14 is a schematic view illustrating the recording operation in a probe memory according to the first specific example.
Figure 15:
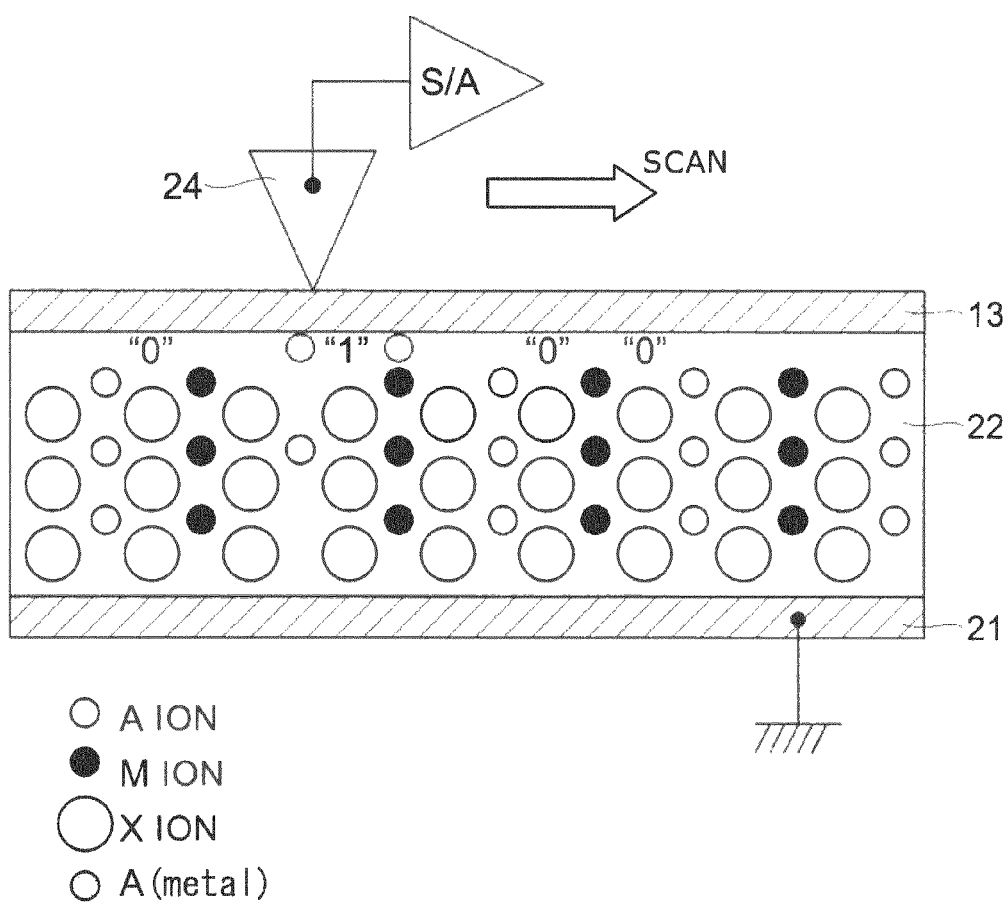
FIG. 15 is a schematic view illustrating the reproducing operation in the probe memory of the first specific example.

The case where the recording units described above in regard to the first specific example and the second specific example are used Here, the case will now be described where the recording units described above in regard to the first specific example and the second specific example are used. In FIG. 14 and FIG. 15, the illustration of the third compound layer 12C of the recording unit according to the second specific example is omitted.

FIG. 14 is a schematic view illustrating the recording.

First, as illustrated in FIG. 14, a state is created in which the electric potential of the probe 24 is lower than the electric potential of the electrode layer 21. Assuming that the electrode layer 21 is set at a fixed potential (e.g. the ground potential), a negative potential may be applied to the probe 24.

The current pulse is generated by, for example, using an electron generation source or a hot electron source to emit electrons from the probe 24 toward the electrode layer 21. Alternatively, the probe 24 may be caused to be in contact with the surface of the recording bit 27 to apply a voltage pulse.

At this time, for example, in the recording bit 27 of the recording layer 22, some of the A ions move to the probe (cathode) 24 side, and the number of A ions in the crystal decreases relative to the number of X ions. Furthermore, the A ion having moved to the probe 24 side receives an electron from the probe 24 to deposit as a metal.

In the recording bit 27, the X ion becomes surplus, and this results in increasing the valence of the A ion or the M ion in the recording bit 27. In other words, since the recording bit 27 is provided with electron conductivity by carrier injection due to the phase change, the resistance in the film thickness direction decreases and the recording (set operation) is completed.

The current pulse for recording may be generated also by creating a state in which the electric potential of the probe 24 is higher than the electric potential of the electrode layer 21.

FIG. 15 is a schematic view illustrating the reproducing.

The reproducing is performed by passing a current pulse through the recording bit 27 of the recording layer 22 and detecting the resistance value of the recording bit 27. However, the current pulse has a value minute enough not to cause the resistance change in the material of the recording bit 27 of the recording layer 22.

For example, a readout current (current pulse) generated by a sense amplifier S/A is passed from the probe 24 to the recording bit 27, and the resistance value of the recording bit 27 is measured with the sense amplifier S/A.

If the material according to the embodiments described above in regard to the first specific example and the second specific example is used, a ratio of the resistance values in the reset/set states of $10^3$ or more can be ensured.

In regard to the reproducing, continuous reproducing becomes possible by scanning the recording medium with the probe 24.

The erase (reset) operation is performed by Joule-heating the recording bit 27 of the recording layer 22 with a large current pulse to accelerate the oxidation reduction reaction in the recording bit 27. Alternatively, a pulse that provides an electric potential difference in the direction opposite to that in the set operation may be applied.

The erase operation may be performed for each recording bit 27, or for a plurality of recording bits 27 or a block as a unit.

Figure 16:
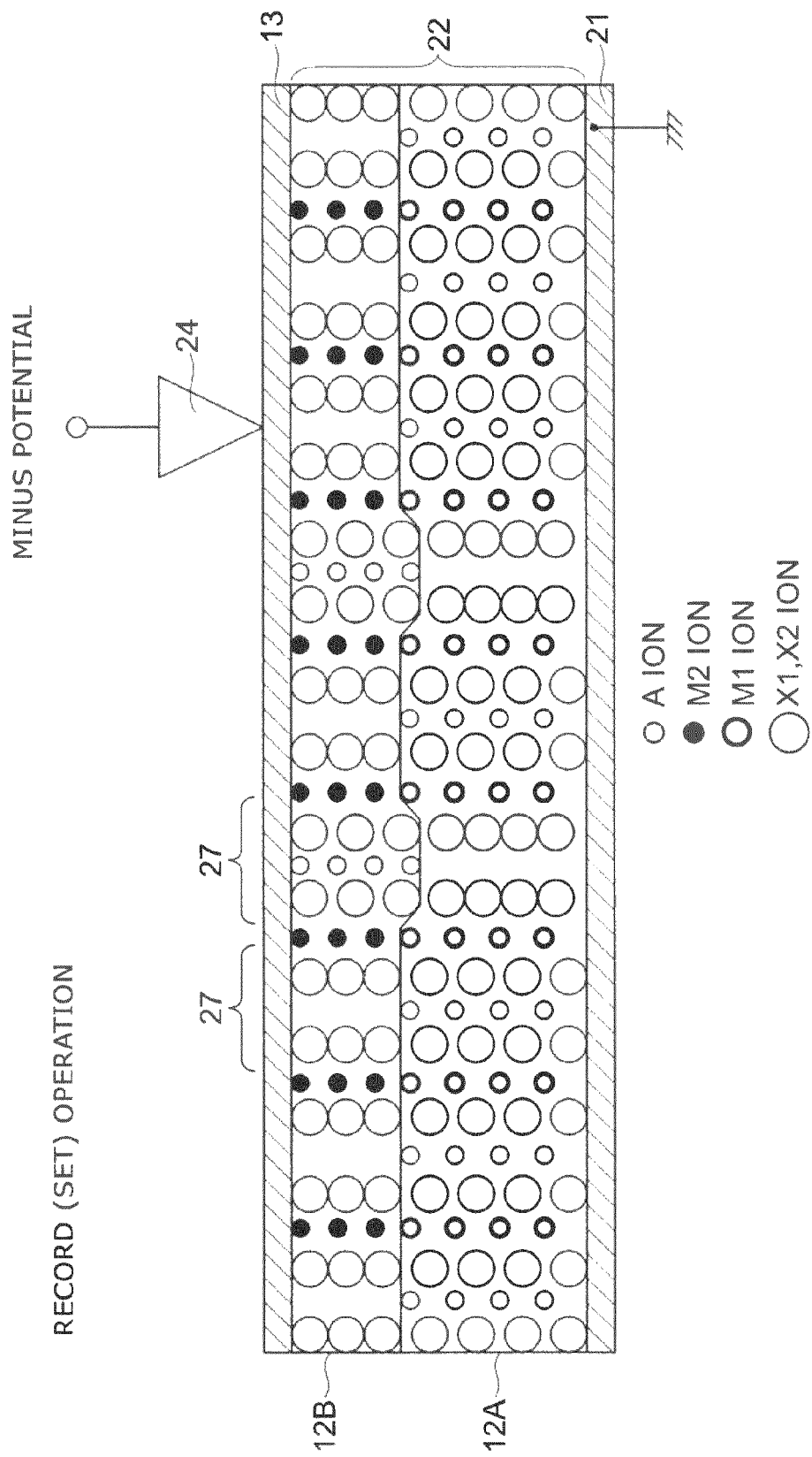
FIG. 16 is a schematic view illustrating the recording operation in a probe memory according to the third specific example.
Figure 17:
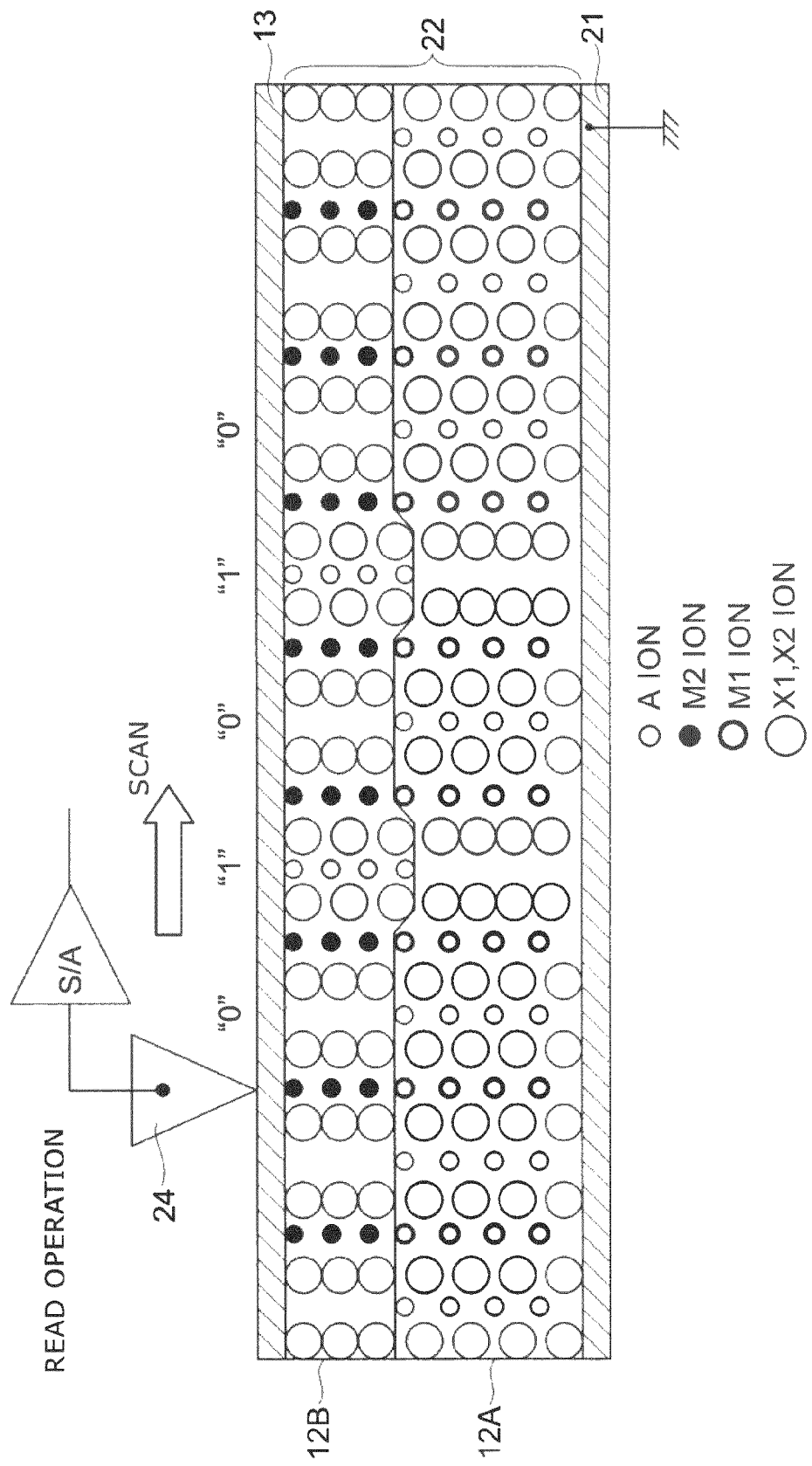
FIG. 17 is a schematic view illustrating the reproducing operation in the probe memory according to the third specific example.

The case where the recording units described above in regard to the third specific example and the fourth specific example are used Next, the case will now be described where the recording units described above in regard to the third specific example and the fourth specific example are used. In FIG. 16 and FIG. 17, the illustration of the third compound layer 12C of the recording unit according to the fourth specific example is omitted.

FIG. 16 is a schematic view illustrating the recording state.

First, as illustrated in FIG. 16, a state is created in which the electric potential of the probe 24 is lower than the electric potential of the electrode layer 21. Assuming that the electrode layer 21 is set at a fixed potential (e.g. the ground potential), a negative potential may be applied to the probe 24.

At this time, some of the A ions in the first compound layer 12A (anode side) of the recording layer 22 move in the crystal to be stored in the void sites of the second compound 12B (cathode side). As a result of this, the valence of the A ion or the M1 ion in the first compound layer 12A increases, and the valence of the A ion or the M2 ion in the second compound layer 12B decreases. Consequently, an electrically conductive carrier is produced in the crystals of the first compound layer 12A and the second compound layer 12B, and both are provided with electrical conductivity.

Thereby, the set operation (recording) is completed.

In the recording operation, if the positional relation of the first compound layer 12A and the second compound layer 12B is reversed, the set operation can be performed by making the electric potential of the probe 24 higher than the electric potential of the electrode layer 21.

FIG. 17 is a schematic view illustrating the state at the time of reproducing.

The reproducing operation is performed by passing a current pulse through the recording bit 27 and detecting the resistance value of the recording bit 27. However, the current pulse has a value minute enough not to cause the resistance change in the material of the recording bit 27.

For example, a readout current (current pulse) generated by the sense amplifier S/A is passed from the probe 24 to the recording layer (recording bit) 22, and the resistance value of the recording bit is measured with the sense amplifier S/A. Using the new material described above can ensure a ratio of the resistance values in the reset/set states of $10^3$ or more.

The reproducing operation can be performed continuously by scanning with the probe 24.

The reset (erase) operation may be performed by using the Joule heat generated by passing a large current pulse through the recording layer (recording bit) 22 and the residual heat thereof to accelerate the action of the A ion returning from the void site in the second compound layer 12B into the first compound layer 12A. Alternatively, a pulse that provides an electric potential difference in the direction opposite to that in the set operation may be applied.

The erase operation may be performed for each recording bit 27, or for a plurality of recording bits 27 or a block as a unit.

Figure 33:
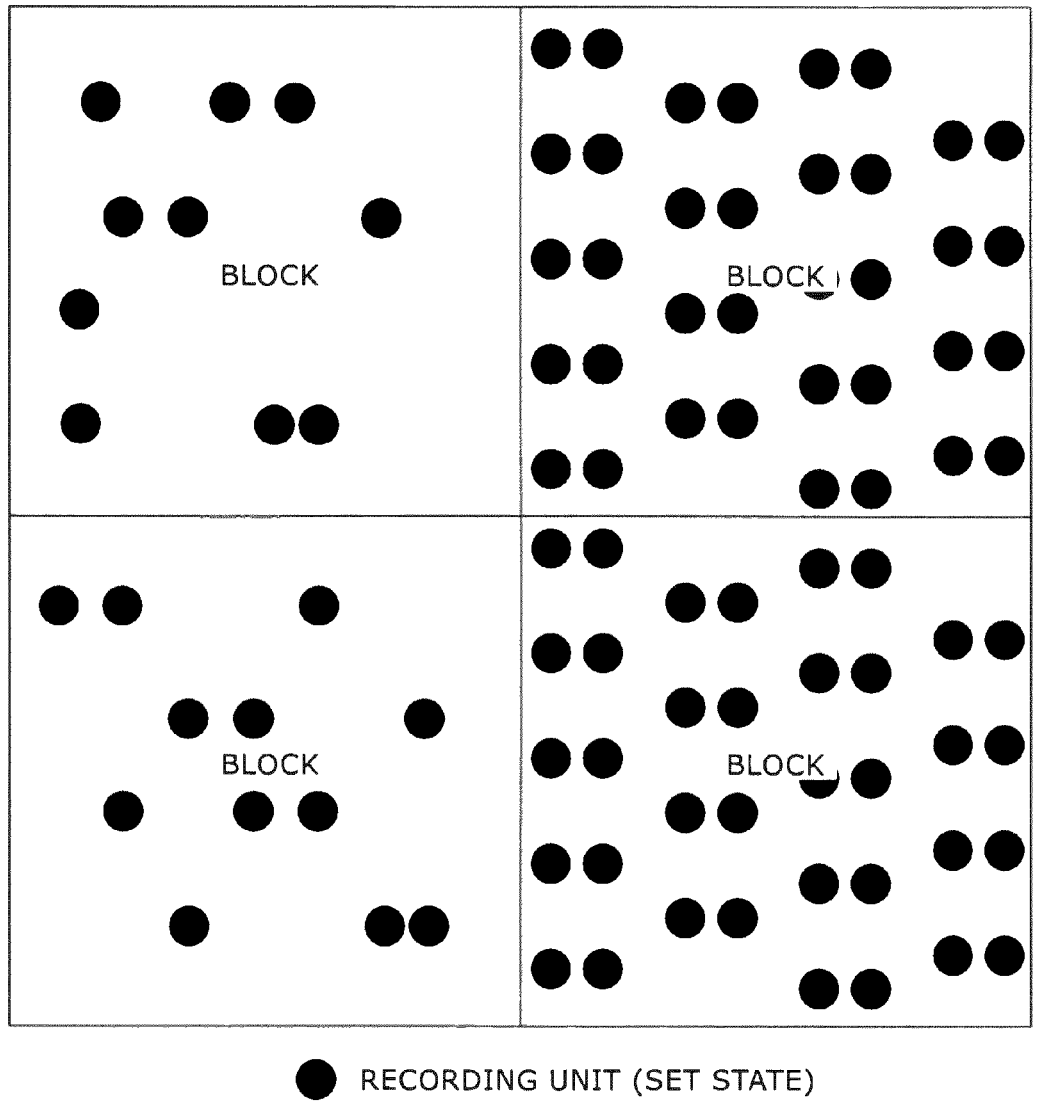
FIG. 33 is a schematic view illustrating blocks in the data region after the information recording is completed into the recording unit according to the third embodiment.

FIG. 33 is a schematic view illustrating blocks in the data region after the information recording is completed. The filled circle represents a recording unit in which information has been recorded.

The probe memory according to this practical example can perform the information recording on recording units of the recording medium similarly to hard disks, and can achieve a higher recording density and lower power consumption than current hard disks and flash memory by using a new recording material.

In the case where the recording layer described above in regard to the second specific example or the fourth specific example is used for the recording layer 22, by providing a high-resistivity insulating layer having an appropriate film thickness, the ON resistance value can be set to an appropriate value to efficiently Joule-heat the recording layer 22 during the reset operation, without inhibiting switching. Thereby, power consumption is reduced. Furthermore, the resistance of the recording layer 22 in the ON state increases to reduce the ON current. Thereby, various operations can be performed with very low power consumption per cell.

Semiconductor Memory

Next, an information recording and reproducing device combined with a semiconductor device will now be described.

Figure 18:
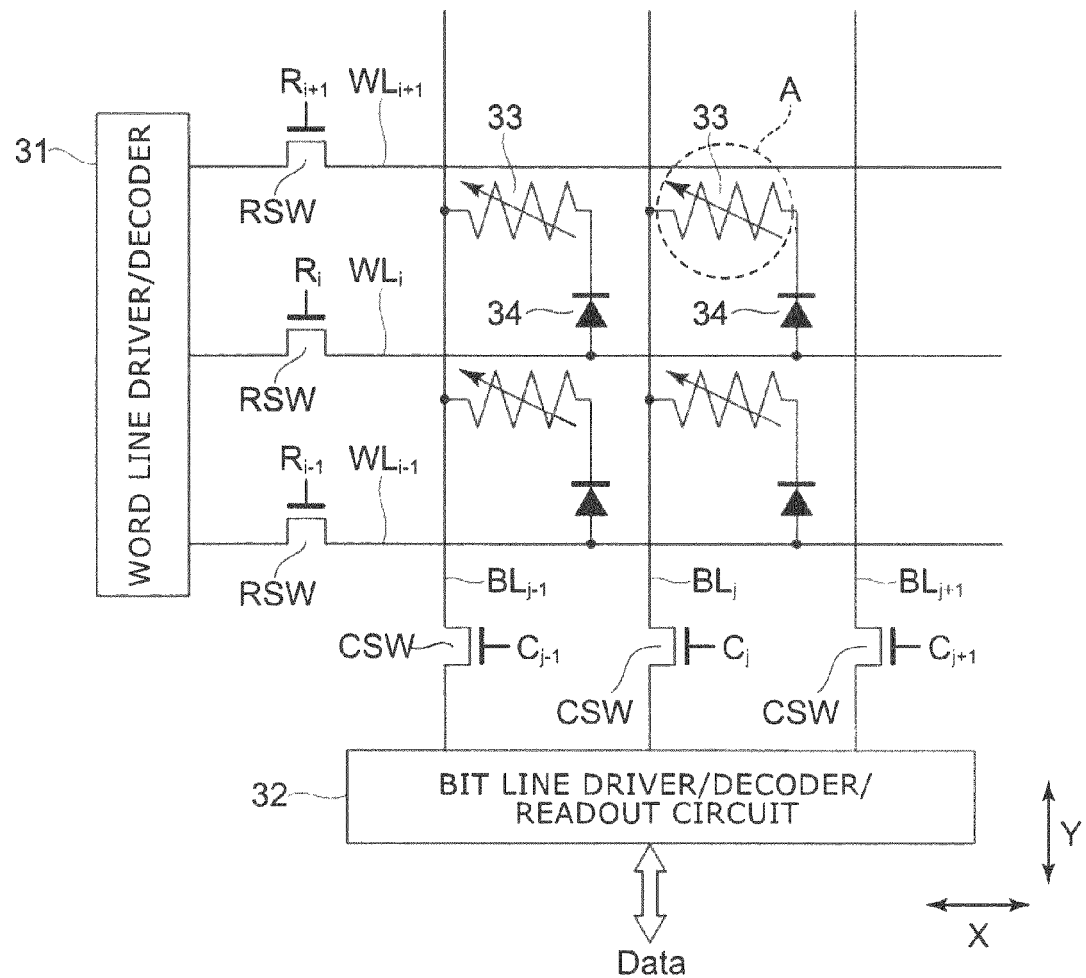
FIG. 18 is a schematic diagram illustrating a cross-point semiconductor memory including the recording layer of the embodiment.

FIG. 18 is a schematic diagram illustrating a cross-point semiconductor memory including the recording layer of this embodiment.

Word lines $WL_{i-1}$, $WL_i$, and $WL_{i+1}$ extend in an X direction and bit lines $BL_{j-1}$, $BL_j$, and $BL_{j+1}$ extend in a Y direction.

One ends of the word lines $WL_{i-1}$, $WL_i$, and $WL_{i+1}$ are connected to a word line driver/decoder 31 via MOS transistors RSW as selection switches, and one ends of the bit lines $BL_{j-1}$, $BL_j$, and $BL_{j+1}$ are connected to a bit line driver/decoder/readout circuit 32 via MOS transistors CSW as selection switches.

Selection signals $R_{i-1}$, $R_i$, and $R_{i+1}$ for selecting one word line (row) are inputted to the gates of the MOS transistors RSW, and selection signals $C_{j-1}$, $C_j$, and $C_{j+1}$ for selecting one bit line (column) are inputted to the gates of the MOS transistors CSW.

A memory cell 33 is disposed at the intersections of the word lines $WL_{i-1}$, $WL_i$, and $WL_{i+1}$ and the bit lines $BL_{j-1}$, $BL_j$, and $BL_{j+1}$. This is what is called a cross-point cell array structure.

A diode 34 for suppressing a sneak current during recording/reproducing is added to the memory cell 33.

Figure 19:
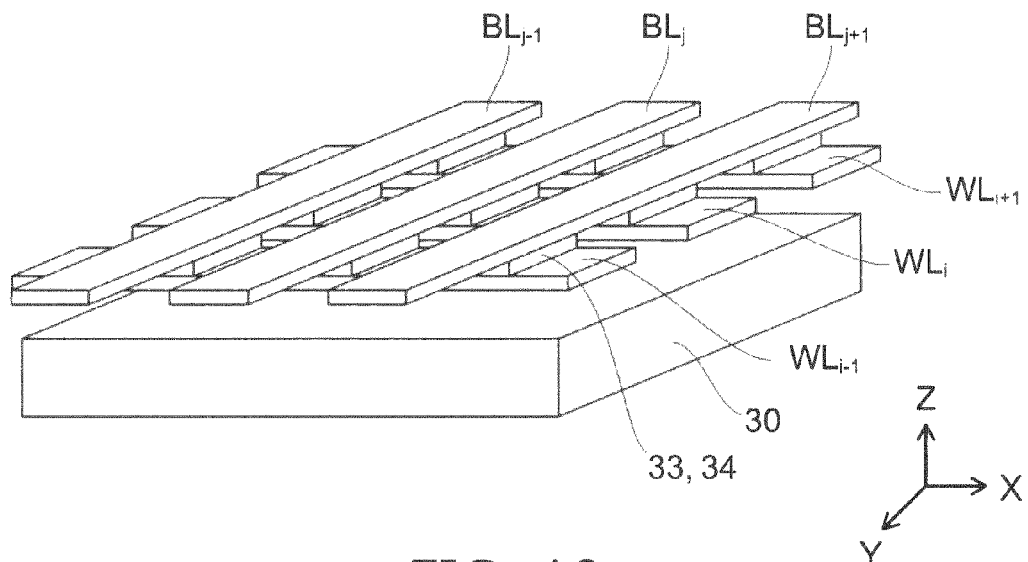
FIG. 19 is a schematic view illustrating the structure of the memory cell array unit of the semiconductor memory shown in FIG. 18.

FIG. 19 is a schematic view illustrating the structure of the memory cell array unit of the semiconductor memory illustrated in FIG. 18.

The word lines $WL_{i-1}$, $WL_i$, and $WL_{i+1}$ and the bit lines $BL_{j-1}$, $BL_j$, and $BL_{j+1}$ are disposed on a semiconductor chip 30, and the memory cell 33 and the diode 34 are disposed at the intersections of these interconnections. A not-illustrated barrier layer may be provided between the diode 34 and the word line ($WL_i$ etc.).

Such a cross-point cell array structure is advantageous to high integration because it is not necessary to connect a MOS transistor individually to the memory cell 33. For example, as illustrated in FIG. 21 and FIG. 22, it is also possible to stack memory cells 33 to construct a three-dimensional memory cell array.

Figure 20:
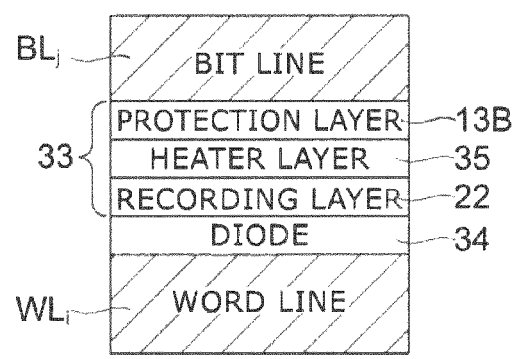
FIG. 20 is a schematic view illustrating the structure of the memory cell of the semiconductor memory shown in FIG. 19.

The memory cell 33 including the recording layer of this embodiment is formed of, for example, a stack structure of the recording layer 22, a protection layer 13B, and a heater layer 35 as illustrated in FIG. 20. One memory cell 33 stores one bit data. The diode 34 is disposed between the word line $WL_i$ and the memory cell 33. As described above, a not-illustrated barrier layer may be provided between the diode 34 and the word line ($WL_i$ etc.).

Figure 21:
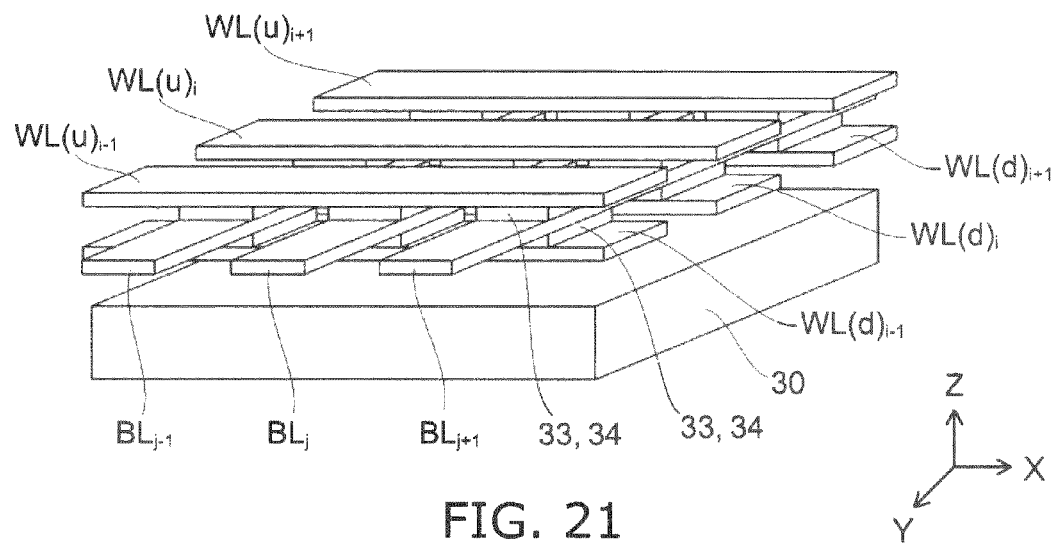
FIG. 21 and FIG. 22 are schematic views illustrating other specific examples of the memory cell array unit shown in FIG. 18.
Figure 22:
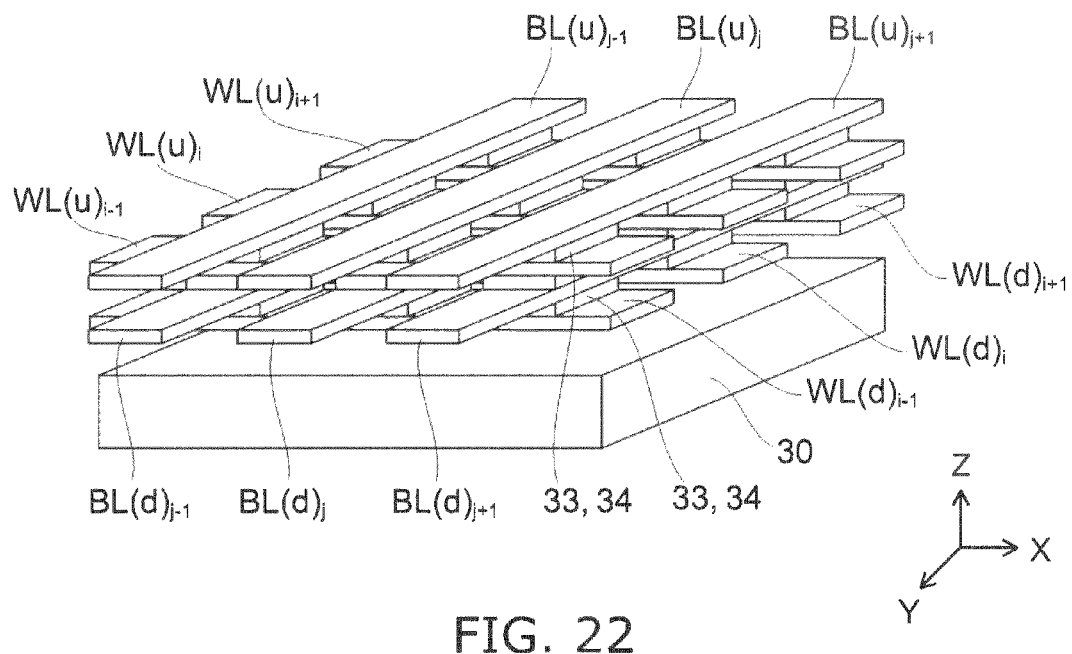

FIG. 21 and FIG. 22 are schematic views illustrating other specific examples of the memory cell array.

In the specific example illustrated in FIG. 21, the word lines $WL_{i-1}$, $WL_i$, and $WL_{i+1}$ extending in the X direction are provided above and below the bit lines $BL_{j-1}$, $BL_j$, and $BL_{j+1}$ extending in the Y direction. The memory cell 33 and the diode 34 are disposed at each of the cross-points of these bit lines and word lines. In other words, this is a structure in which the bit line is shared between the memory cells thereabove and therebelow. A not-illustrated barrier layer may be provided between the diode 34 and the word line (WL(d)$_i$ etc.) and between the diode 34 and the bit line (BL$_j$ etc.).

The specific example illustrated in FIG. 22 has a structure in which the bit lines BL$_{j-1}$, BL$_j$, and BL$_{j+1}$ extending in the Y direction and the word lines WL$_{i-1}$, WL$_i$, and WL$_{i+1}$ extending in the X direction are alternately stacked. The memory cell 33 and the diode 34 are disposed at each of the cross-points of these bit lines and word lines. In other words, this is a structure in which the bit line and the word line are shared between the memory cells thereabove and therebelow. A not-illustrated barrier layer may be provided between the diode 34 and the word line (WL(d)$_i$ etc.), between the diode 34 and the bit line (BL(d)$_j$), and between the diode 34 and the word line (WL(u)$_i$ etc.).

Using a stack structure like those illustrated in FIG. 21 and FIG. 22 allows increasing the recording density.

Next, the recording/reproducing operation of the semiconductor memory using the recording layer of this embodiment will now be described with reference to FIG. 18 to FIG. 20.

Here, the case will now be described where the memory cell 33 surrounded by a dotted line "A" in FIG. 18 is selected and the recording/reproducing operation is performed in this cell.
The case where the recording layers described above in regard to the first specific example and the second specific example are used The recording (set operation) may be performed by applying a voltage to the selected memory cell 33 to generate an electric potential gradient in the memory cell 33 to pass a current pulse therethrough. Therefore, a state is created in which, for example, the electric potential of the word line WL$_i$ is lower than the electric potential of the bit line BL$_j$. Assuming that the bit line BL$_j$ is set at a fixed potential (e.g. the ground potential), a negative potential may be applied to the word line WL$_i$.

At this time, in the selected memory cell 33 surrounded by the dotted line "A", some of the A ions move to the word line (cathode) WL$_i$ side, and the number of A ions in the crystal decreases relative to the number of X ions. Furthermore, the A ion having moved to the word line WL$_i$ side receives an electron from the word line WL$_i$ to deposit as a metal.

In the selected memory cell 33 surrounded by the dotted line "A", the X ion becomes surplus, and this results in increasing the valence of the A ion or the M ion in the crystal. In other words, the selected memory cell 33 surrounded by the dotted line "A" is provided with electron conductivity by carrier injection due to the phase change, and the recording (set operation) is thereby completed.

At the time of recording, all the not-selected word lines WL$_{i-1}$ and WL$_{i+1}$ and all the not-selected bit lines BL$_{j-1}$ and BL$_{j+1}$ are preferably biased to the same electric potential.

At the time of standby before recording, all the word lines WL$_{i-1}$, WL$_i$, and WL$_{i+1}$ and all the bit lines BL$_{j-1}$, BL$_j$, and BL$_{j+1}$ are preferably precharged.

The current pulse for recording may be generated also by creating a state in which the electric potential of the word line WL$_i$ is higher than the electric potential of the bit line BL$_j$.

The reproducing is performed by passing a current pulse through the selected memory cell 33 surrounded by the dotted line "A" and detecting the resistance value of the memory cell 33. However, the current pulse is set to a value minute enough not to cause the resistance change in the material of the memory cell 33.

For example, a readout current (current pulse) generated by the readout circuit is passed from the bit line BL$_j$ to the memory cell 33 surrounded by the dotted line "A", and the resistance value of the memory cell 33 is measured with the readout circuit. Using the new material described above can ensure a ratio of the resistance values in the reset/set states of $10^3$ or more.

The erase (reset) operation is performed by Joule-heating the selected memory cell 33 surrounded by the dotted line "A" with a large current pulse to accelerate the oxidation reduction reaction in the memory cell 33.

The case where the recording layers described above in regard to the third specific example and the fourth specific example are used The recording operation (set operation) may be performed by applying a voltage to the selected memory cell 33 to generate an electric potential gradient in the memory cell 33 to pass a current pulse therethrough. Therefore, for example, the electric potential of the word line WL$_i$ is made lower than the electric potential of the bit line BL$_j$. Assuming that the bit line BL$_j$ is set at a fixed potential (e.g. the ground potential), a negative potential may be applied to the word line WL$_i$.

At this time, in the selected memory cell 33 surrounded by the dotted line "A", some of the A ions in the first compound layer 12A move to the void sites of the second compound layer 12B. Accordingly, the valence of the A ion or the M2 ion in the second compound layer decreases, and the valence of the A ion or the M1 ion in the first compound layer 12A increases. Consequently, an electrically conductive carrier is produced in the crystals of the first compound layer 12A and the second compound layer 12B, and both are provided with electrical conductivity.

Thereby, the set operation (recording) is completed.

At the time of recording, all the not-selected word lines WL$_{i-1}$ and WL$_{i+1}$ and all the not-selected bit lines and BL$_{j-1}$ and BL$_{j+1}$ are preferably biased to the same electric potential.

At the time of standby before recording, all the word lines WL$_{i-1}$, WL$_i$, and WL$_{i+1}$ and all the bit lines BL$_{j-i}$, BL$_j$, and BL$_{j+1}$ are preferably precharged.

The current pulse may be generated also by creating a state in which the electric potential of the word line WL$_i$ is higher than the electric potential of the bit line BL$_j$.

The reproducing operation is performed by passing a current pulse through the selected memory cell 33 surrounded by the dotted line "A" and detecting the resistance value of the memory cell 33. However, the current pulse is set to a value minute enough not to cause the resistance change in the material of the memory cell 33.

For example, a readout current (current pulse) generated by the readout circuit is passed from the bit line BL$_j$ to the memory cell 33 surrounded by the dotted line "A", and the resistance value of the memory cell 33 is measured with the readout circuit. Using the new material described above can ensure a ratio of the resistance values in the reset/set states of $10^3$ or more.

The reset (erase) operation is performed by using the Joule heat generated by passing a large current pulse through the selected memory cell 33 surrounded by the dotted line "A" and the residual heat thereof to accelerate the action of the A ion element returning from the void site in the second compound layer 12B into the first compound layer 12A.

As described above, the semiconductor memory of this embodiment can achieve a higher recording density and lower power consumption than current hard disks and flash memory.

In the case where the recording layer described above in regard to the second specific example or the fourth specific example is used for the recording layer 22, by providing a high-resistivity insulating layer having an appropriate film thickness, the ON resistance value can be set to an appropriate value to efficiently Joule-heat the recording layer 22 during the reset operation, without inhibiting switching. Thereby, power consumption is reduced. Furthermore, the resistance of the recording layer 22 in the ON state increases to reduce the ON current. Thereby, various operations can be performed with very low power consumption per cell.

Flash Memory

This embodiment can be also used for a flash memory.

Figure 23:
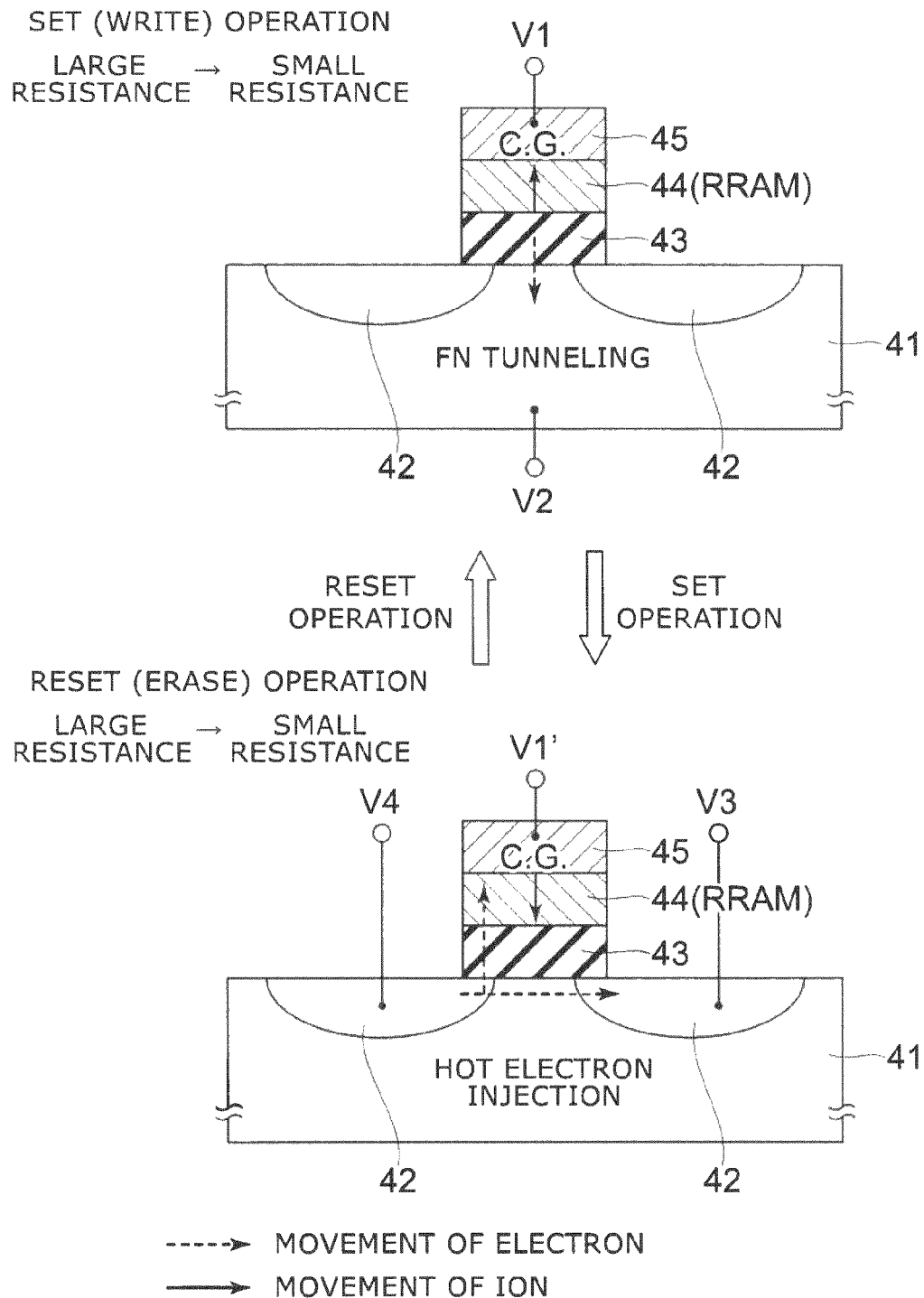
FIG. 23 is a schematic cross-sectional view illustrating a memory cell of a flash memory according to the embodiment.

FIG. 23 is a schematic cross-sectional view illustrating a memory cell of a flash memory.

The memory cell of the flash memory is formed of a MIS (metal-insulator-semiconductor) transistor.

Diffusion layers 42 are formed in the surface region of a semiconductor substrate 41. A gate insulating layer 43 is formed on the channel region between the diffusion layers 42. A recording layer (RRAM: resistive RAM) 44 of this embodiment is formed on the gate insulating layer 43. A control gate electrode 45 is formed on the recording layer 44.

The semiconductor substrate 41 may be a well region, and the semiconductor substrate 41 and the diffusion layer 42 have mutually opposite electrical conductivity types. The control gate electrode 45 forms a word line, and is formed of, for example, a conductive polysilicon.

The recording layer 44 is formed of the material of the recording layer 12 described above in regard to the first specific example to the fourth specific example.

The basic operation of the device will now be described with reference to FIG. 23.

The set (write) operation is performed by applying an electric potential V1 to the control gate electrode 45 and applying an electric potential V2 to the semiconductor substrate 41.

The difference between the electric potentials V1 and V2 is set large enough to phase-change or resistance-change the recording layer 44. The direction thereof is not limited in particular.

That is, either V1>V2 or V1<V2 is possible.

For example, assuming that the recording layer 44 is an insulator (resistance being large) in the initial state (reset state), the gate insulating layer 43 is substantially thick, and therefore the threshold of the memory cell (MIS transistor) is high.

If the recording layer 44 is changed from this state to a conductor (resistance being small) by applying the electric potentials V1 and V2, the gate insulating layer 43 becomes substantially thin, and therefore the threshold of the memory cell (MIS transistor) becomes low.

Although the electric potential V2 was applied to the semiconductor substrate 41, instead the electric potential V2 may be transmitted from the diffusion layer 42 to the channel region of the memory cell.

The reset (erase) operation is performed by applying an electric potential V1' to the control gate electrode 45, applying an electric potential V3 to one of the diffusion layers 42, and applying an electric potential V4 (<V3) to the other of the diffusion layers 42.

The electric potential V1' is set to a value exceeding the threshold of the memory cell in the set state.

At this time, the memory cell becomes ON, electrons flow from the other of the diffusion layers 42 toward the one, and hot electrons are generated. Since the hot electrons are injected into the recording layer 44 via the gate insulating layer 43, the temperature of the recording layer 44 increases.

Thereby, the recording layer 44 changes from the conductor (resistance being small) to the insulator (resistance being large). Therefore, the gate insulating layer 43 becomes substantially thick, and the threshold of the memory cell (MIS transistor) becomes high.

Thus, the threshold of the memory cell can be changed by a similar principle to flash memory. Therefore, the information recording and reproducing device according to the example of this embodiment can be put to practical use by utilizing the technology of flash memory.

NAND Flash Memory

Figure 24:
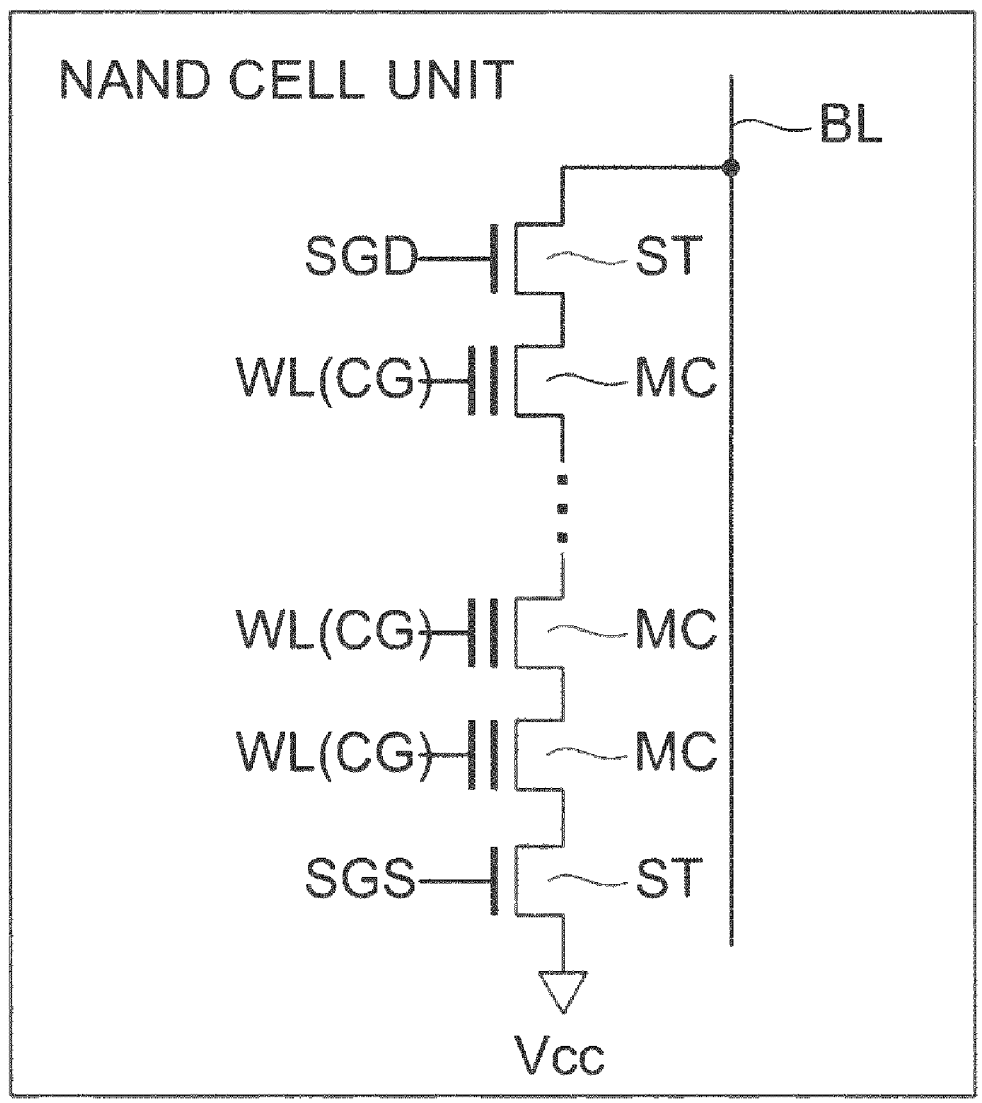
FIG. 24 is a circuit diagram of a NAND cell unit according to the embodiment.

FIG. 24 is a circuit diagram of a NAND cell unit.

Figure 25:
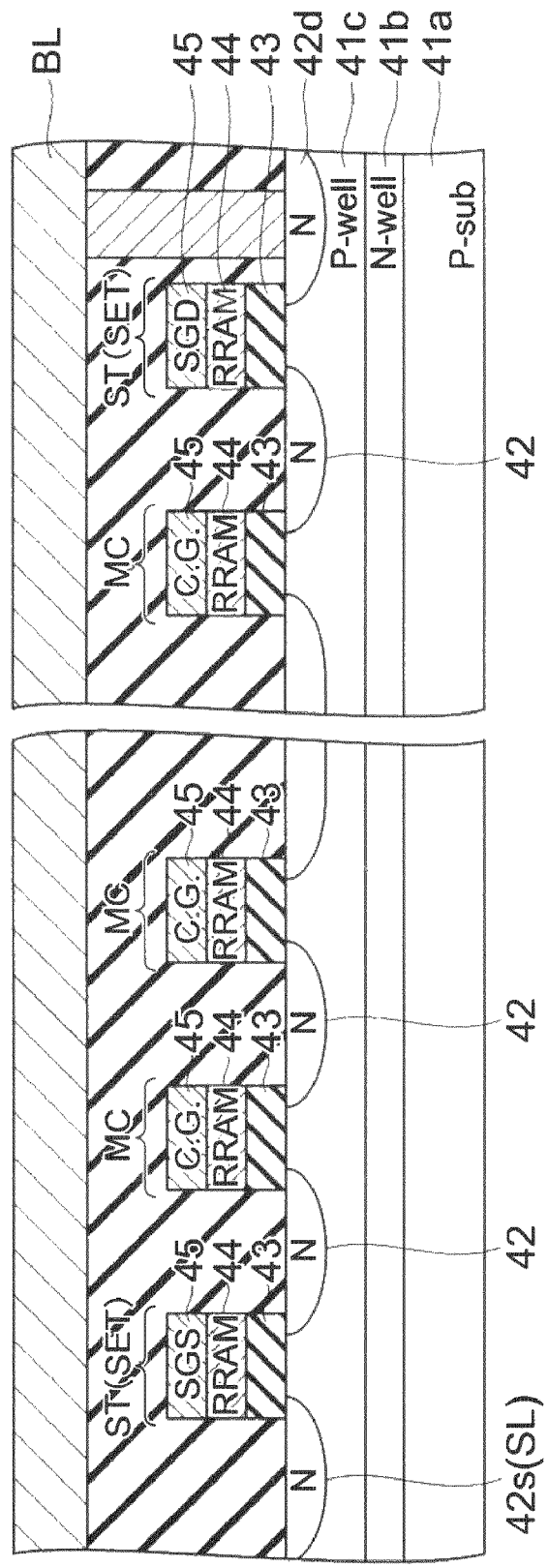
FIG. 25 to FIG. 27 are schematic views illustrating the specific example of a NAND cell unit according to the embodiment.

FIG. 25 is a schematic view illustrating the structure of a NAND cell unit according to this embodiment.

An N-type well region 41b and a P-type well region 41c are formed in a P-type semiconductor substrate 41a. A NAND cell unit according to an example of this embodiment is formed in the P-type well region 41c.

The NAND cell unit is formed of: a NAND string including a plurality of memory cells MC connected in series; and a total of two selection gate transistors ST connected to both ends of the NAND string one by one.

The memory cell MC and the selection gate transistor ST have the same structure. Specifically, these each are formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44.

The state (insulator/conductor) of the recording layer 44 of the memory cell MC can be changed by the basic operation described above. In contrast, the recording layer 44 of the selection gate transistor ST is kept in the set state, namely, a conductor (resistance being small).

One of the selection gate transistors ST is connected to a source line SL, and the other is connected to a bit line BL.

It is assumed that, before the set (write) operation, all the memory cells in the NAND cell unit are in the reset state (resistance being large).

The set (write) operation is performed successively from the memory cell MC on the source line SL side toward the memory cell on the bit line BL side one by one.

V1 (a plus potential) is applied to the selected word line (control gate electrode) WL as a write potential, and Vpass is applied to the not-selected word line WL as a transmission potential (an electric potential at which the memory cell MC becomes ON).

The selection gate transistor ST on the source line SL side is switched to OFF, the selection gate transistor ST on the bit line BL side is switched to ON, and program data is transmitted from the bit line BL to the channel region of the selected memory cell MC.

For example, when the program data is "1", a write inhibit potential (for example, an electric potential of approximately V1) is transmitted to the channel region of the selected memory cell MC so that the resistance value of the recording layer 44 of the selected memory cell MC may not change from a high level to a low level.

Furthermore, when the program data is "0", V2 (<V1) is transmitted to the channel region of the selected memory cell MC to change the resistance value of the recording layer 44 of the selected memory cell MC from a high level to a low level.

In the reset (erase) operation, for example, V1' is applied to all the word lines (control gate electrodes) WL to switch all the memory cells MC in the NAND cell unit to ON. Furthermore, the two selection gate transistors ST are switched to ON, V3 is applied to the bit line BL, and V4 (<V3) is applied to the source line SL.

At this time, since hot electrons are injected into the recording layers 44 of all the memory cells MC in the NAND cell unit, the reset operation is performed collectively for all the memory cells MC in the NAND cell unit.

The readout operation is performed by applying a readout potential (plus potential) to the selected word line (control gate electrode) WL, while an electric potential at which the memory cell MC becomes ON irrespective of the data "0" or "1" is applied to the not-selected word line (control gate electrode) WL.

Furthermore, the two selection gate transistors ST are switched to ON, and a readout current is supplied to the NAND string.

Since the selected memory cell MC becomes ON or OFF in accordance with the value of the data stored therein when the readout potential is applied, the data can be read out by, for example, detecting the change of the readout current.

Figure 26:
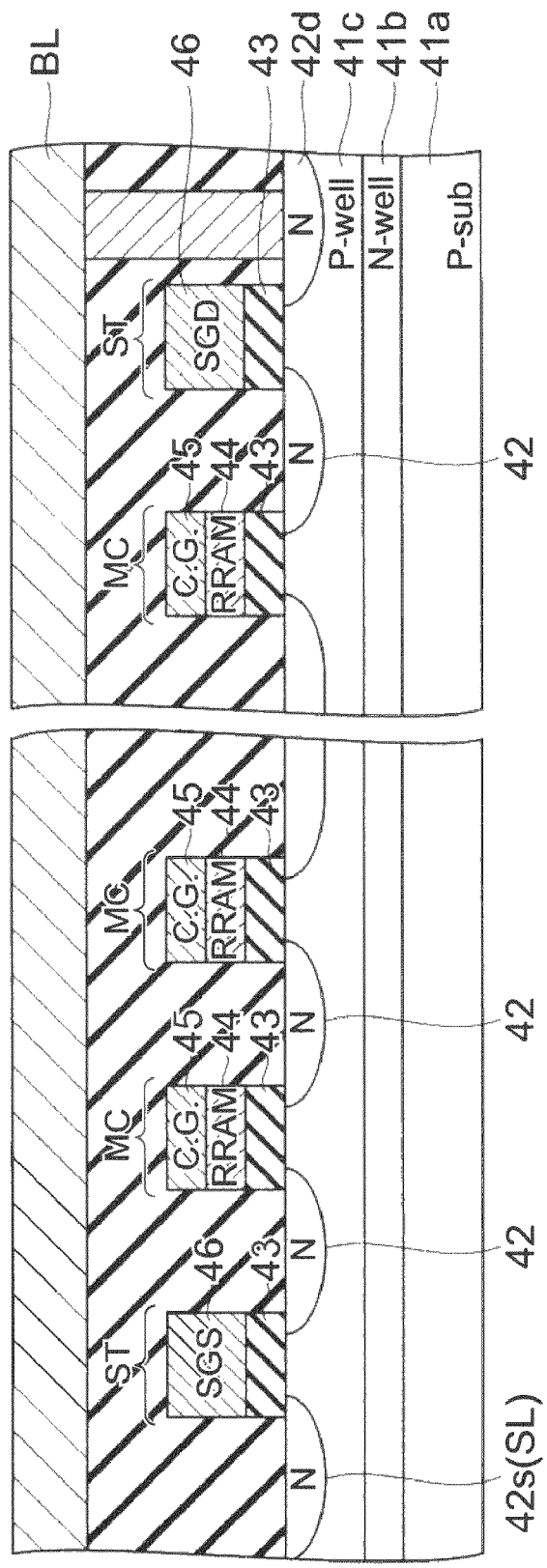

Although the selection gate transistor ST has the same structure as the memory cell MC in the structure illustrated in FIG. 25, the selection gate transistor ST may be a common MIS transistor without forming the recording layer as illustrated in FIG. 26, for example.

Figure 27:
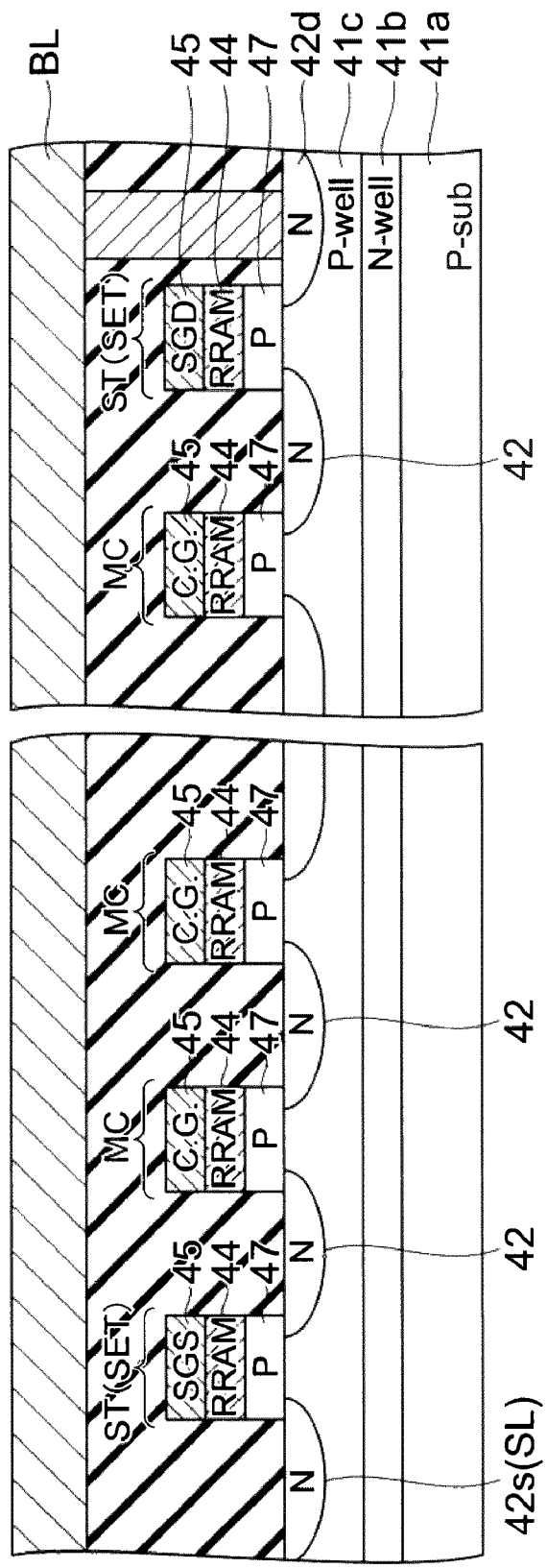

FIG. 27 is a schematic view illustrating an alteration example of the NAND flash memory.

This alteration example has a structure in which the gate insulating layers of the plurality of memory cells MC included in the NAND string are replaced with P-type semiconductor layers 47.

If high integration progresses and the memory cell MC is downsized, the P-type semiconductor layer 47 is filled with a depletion layer in a state in which no voltage is applied.

At the time of set (writing), a plus write potential (e.g. 3.5 V) is applied to the control gate electrode 45 of the selected memory cell MC, and a plus transmission potential (e.g. 1 V) is applied to the control gate electrode 45 of the not-selected memory cell MC.

At this time, the surfaces of the P-type well regions 41c of the plurality of memory cells MC in the NAND string are reversed from the P type to the N type and channels are formed.

Accordingly, as described above, the set operation can be performed by switching the selection gate transistor ST on the bit line BL side to ON and transmitting the program data "0" from the bit line BL to the channel region of the selected memory cell MC.

The reset (erasing) can be performed collectively for all the memory cells MC included in the NAND string by, for example, applying a minus erase potential (e.g. −3.5 V) to all the control gate electrodes 45 and applying the ground potential (0 V) to the P-type well region 41c and the P-type semiconductor layer 47.

At the time of readout, a plus readout potential (e.g. 0.5 V) is applied to the control gate electrode 45 of the selected memory cell MC, and a transmission potential (e.g. 1 V) at which the memory cell MC becomes ON irrespective of the data "0" or "1" is applied to the control gate electrode 45 of the not-selected memory cell MC.

However, the threshold voltage Vth"1" of the memory cell MC in the "1" state satisfies $0\,\text{V}<\text{Vth"1"}<0.5\,\text{V}$, and the threshold voltage Vth"0" of the memory cell MC in the "0" state satisfies $0.5\,\text{V}<\text{Vth"0"}<1\,\text{V}$.

Furthermore, the two selection gate transistors ST are switched to ON, and a readout current is supplied to the NAND string.

In such a state, the amount of the current flowing through the NAND string changes in accordance with the value of the data stored in the selected memory cell MC, and the data can be thus read out by detecting the change.

In this alteration example, the hole doping amount of the P-type semiconductor layer 47 is preferably larger than that of the P-type well region 41c, and the Fermi level of the P-type semiconductor layer 47 is preferably deeper than that of the P-type well region 41c by about 0.5 V.

This is in order that, when a plus potential is applied to the control gate electrode 45, the inversion from the P type to the N type may start from the surface portion of the P-type well region 41c between the N-type diffusion layers 42 to form a channel.

In this way, for example, the channel of the not-selected memory cell MC is formed only at the interface between the P-type well region 41c and the P-type semiconductor layer 47 during writing, and the channels of the plurality of memory cells MC in the NAND string are formed only at the interface between the P-type well region 41c and the P-type semiconductor layer 47 during readout.

In other words, even if the recording layer 44 of the memory cell MC is a conductor (in the set state), the diffusion layer 42 and the control gate electrode 45 do not short-circuit.

NOR Flash Memory

Figure 28:
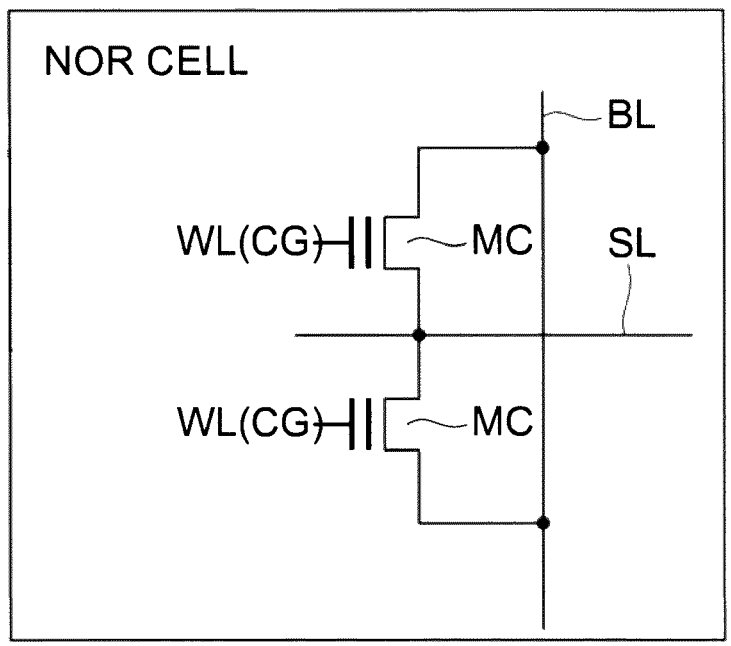
FIG. 28 is a circuit diagram of a NOR cell unit according to the embodiment.

FIG. 28 is a circuit diagram of a NOR cell unit.

Figure 29:
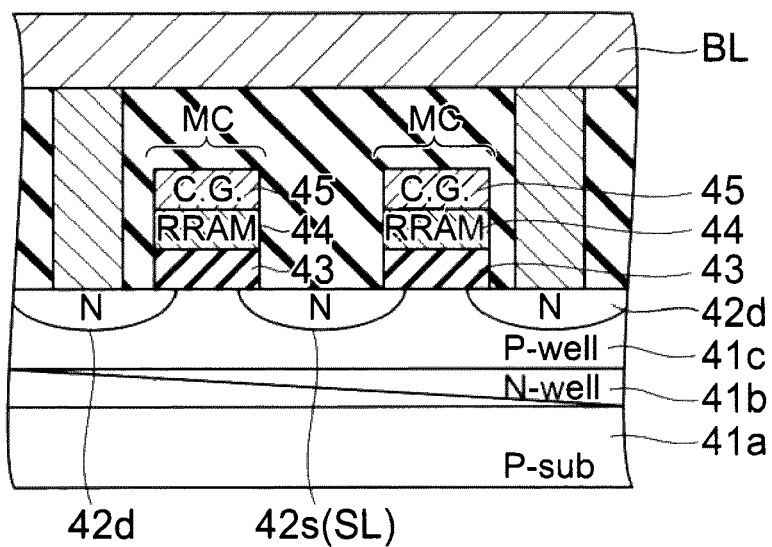
FIG. 29 is a schematic view illustrating the structure of a NOR cell unit according to the embodiment.

FIG. 29 is a schematic view illustrating the structure of a NOR cell unit according to an example of this embodiment.

The N-type well region 41b and the P-type well region 41c are formed in the P-type semiconductor substrate 41a. A NOR cell according to an example of this embodiment is formed in the P-type well region 41c.

The NOR cell is formed of one memory cell (MIS transistor) MC connected to the bit line BL and the source line SL.

The memory cell MC is formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44. The state (insulator/conductor) of the recording layer 44 of the memory cell MC can be changed by the basic operation described above.

Two-Transistor Flash Memory

Figure 30:
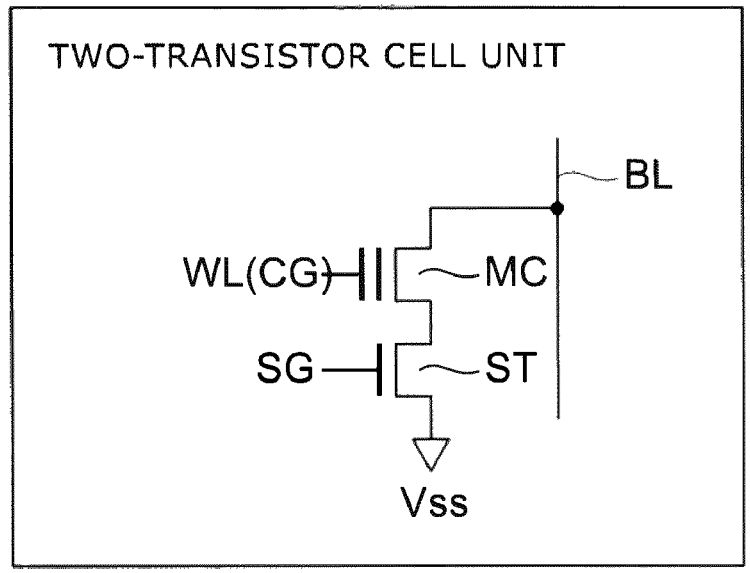
FIG. 30 is a circuit diagram of a two-transistor cell unit according to the embodiment.

FIG. 30 is a circuit diagram of a two-transistor cell unit.

Figure 31:
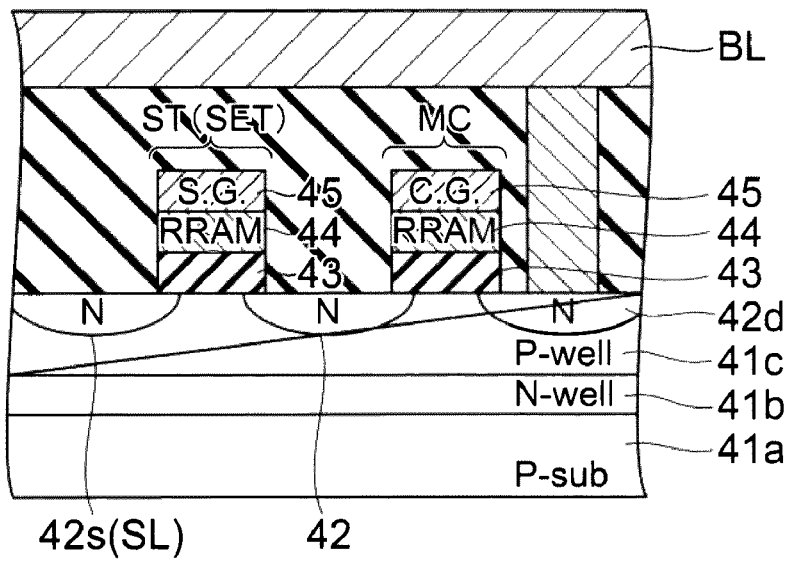
FIG. 31 to FIG. 32 are schematic views illustrating the specific example of a two-transistor cell unit according to the embodiment.

FIG. 31 is a schematic view illustrating the structure of a two-transistor cell unit according to this embodiment.

The two-transistor cell unit has been recently developed as a new cell structure that has both the feature of the NAND cell unit and that of the NOR cell.

The N-type well region 41b and the P-type well region 41c are formed in the P-type semiconductor substrate 41a. The two-transistor cell unit according to an example of this embodiment is formed in the P-type well region 41c.

The two-transistor cell unit is formed of one memory cell MC and one selection gate transistor ST connected in series.

The memory cell MC and the selection gate transistor ST have the same structure. Specifically, these each are formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44.

The state (insulator/conductor) of the recording layer 44 of the memory cell MC can be changed by the basic operation described above. In contrast, the recording layer 44 of the selection gate transistor ST is kept in the set state, namely, a conductor (resistance being small).

The selection gate transistor ST is connected to the source line SL, and the memory cell MC is connected to the bit line BL.

Figure 32:
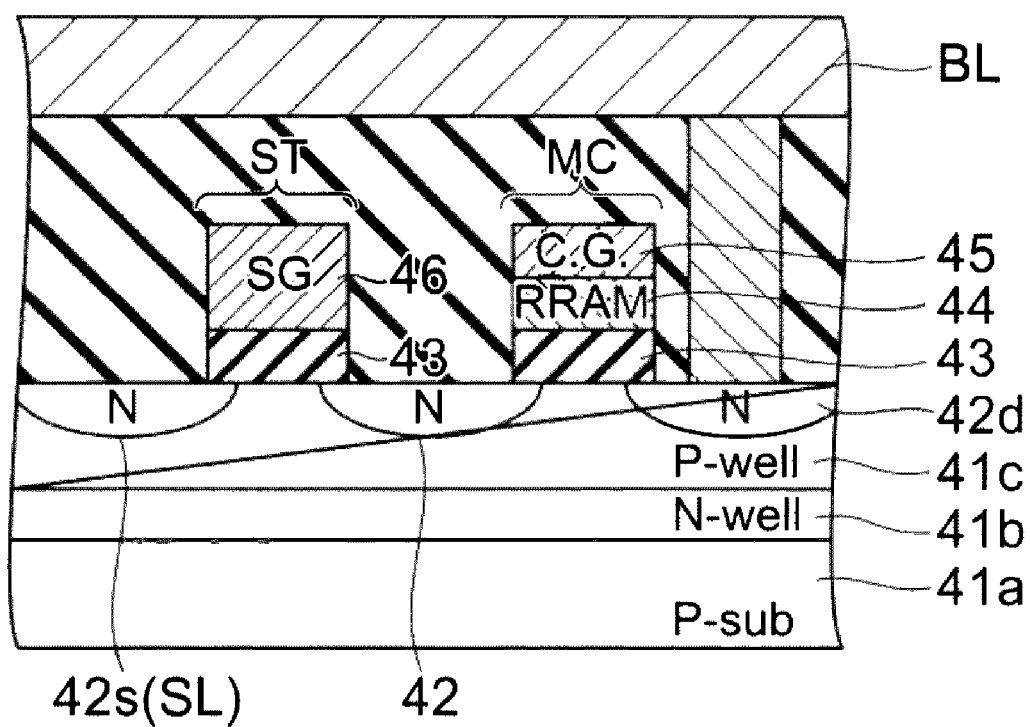

Although the selection gate transistor ST has the same structure as the memory cell MC in the structure illustrated in FIG. 31, the selection gate transistor ST may be a common MIS transistor without forming the recording layer as illustrated in FIG. 32, for example.

Other than the above, the materials and principles presented by this embodiment may be used for recording media such as current hard disks and DVDs.

In these flash memories, in the case where the recording layer described above in regard to the second specific example or the fourth specific example is used for the recording layer 44, by providing the high-resistivity insulating layer having an appropriate film thickness, the ON resistance value can be set to an appropriate value to efficiently Joule-heat the recording layer 44 during the reset operation, without inhibiting switching. Thereby, power consumption is reduced. Furthermore, the resistance of the recording layer 44 in the ON state increases to reduce the ON current. Thereby, various operations can be performed with very low power consumption per cell.

Next, a method for manufacturing a recording medium according to the embodiment of the invention will now be described.

Here, a description is given by dealing with the structure of the recording medium illustrated in FIG. 13 as an example.

A disk made of glass having a diameter of about 60 mm and a thickness of about 1 mm is used as the substrate 20. On the substrate 20 like this, Pt (platinum) is deposited with a thickness of about 500 nm to form the electrode layer 21.

On the electrode layer 21, first, a target with a composition having been adjusted so that TiN may be deposited is used to perform film-formation by using an RF power source with a power having been adjusted so as to obtain the (110) orientation. Subsequently, a target with a composition having been adjusted so that $ZnMn_2O_4$ may be deposited is used to perform RF magnetron sputtering in an atmosphere with a temperature of 300 to 600° C. and a composition of 95% Ar (argon) and 5% $O_2$ (oxygen) to form $ZnMn_2O_4$ with a thickness of about 10 nm, which forms part of the recording layer 22.

Subsequently, $TiO_2$ with a thickness of about 3 nm is formed on the $ZnMn_2O_4$ by RF magnetron sputtering. Consequently, the recording layer 22 has a stack structure of $ZnMn_2O_4$ and $TiO_2$.

Finally, the protection layer 13B is formed on the recording layer 22. Thus, a recording medium like that illustrated in FIG. 13 is completed.

EXPERIMENTAL EXAMPLES

Next, experimental examples will now be described in which some samples are prepared and the resistance difference between the reset (erase) state and the set (write) state is investigated.

A recording medium having the structure illustrated in FIG. 12 is used as a sample. The investigation is performed by using a probe pair having narrowed tips with a diameter of 10 nm or less.

The probe pair is caused to be in contact with the protection layer 13B, and the writing/erasing is performed by using one of the probe pair. The writing is performed by, for example, applying a voltage pulse of 1 V with a width of 10 nsec to the recording layer 22. The erasing is performed by, for example, applying a voltage pulse of 0.2 V with a width of 100 nsec to the recording layer 22.

Furthermore, between writing and erasing, the readout is performed by using the other of the probe pair. The readout is performed by applying a voltage pulse of 0.1 V with a width of 10 nsec to the recording layer 22 and measuring the resistance value of the recording layer (recording bit) 22.

First Experimental Example

The specifications of the sample of a first experimental example are as follows.

The recording layer 22 is formed of a stack structure that includes $Zn_{1.1}Mn_{1.9}O_4$ with a thickness of about 10 nm, $ZnAl_2O_4$ with a thickness of about 1 nm, and $TiO_2$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Second Experimental Example

The specifications of the sample of a second experimental example are as follows.

The recording layer 22 is formed of a stack structure that includes $ZnCo_2O_4$ with a thickness of about 10 nm, $ZnAl_2O_4$ with a thickness of about 1 nm, and $TiO_2$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Third Experimental Example

The specifications of the sample of a third experimental example are as follows.

The recording layer 22 is formed of a stack structure that includes $ZnMn_2O_4$ with a thickness of about 10 nm, $Zn_2TiO_4$ with a thickness of about 1 nm, and $TiO_2$ with a thickness of about 5 nm.

In this case, the result is expected that the resistance value in the reset state is at the level of $10^7 \Omega$, and the resistance value in the set state is at the level of $10^5 \Omega$. Furthermore, the cycle lifetime is expected to be not less than a hundred thousand cycles.

Fourth Experimental Example

The specifications of the sample of a fourth experimental example are as follows.

The recording layer 22 is formed of a stack structure that includes $ZnCo_2O_4$ with a thickness of about 10 nm, $Zn_2SnO_4$ with a thickness of about 1 nm, and $ZrO_2$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Fifth Experimental Example

The specifications of the sample of a fifth experimental example are as follows.

The recording layer 22 is formed of a stack structure that includes $ZnMoO_3$ with a thickness of about 10 nm, $ZnGeO_3$ with a thickness of about 1 nm, and $TiO_2$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Sixth Experimental Example

The specifications of the sample of a sixth experimental example are as follows.

The recording layer 22 is formed of a stack structure that includes $ZnWO_3$ with a thickness of about 10 nm, $ZnSnO_3$ with a thickness of about 1 nm, and $ZrO_2$ containing 3% Nb and having a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Seventh Experimental Example

The specifications of the sample of a seventh experimental example are as follows.

The recording layer 22 is formed of a stack structure that includes $ZnNbN_2$ with a thickness of about 10 nm, $ZnGeN_2$ with a thickness of about 1 nm, and NbON with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Eighth Experimental Example

The specifications of the sample of an eighth experimental example are as follows.

The recording layer 22 is formed of a stack structure that includes $ZnTaN_2$ with a thickness of about 10 nm, $ZnGeN_2$ with a thickness of about 1 nm, and TaON with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Ninth Experimental Example

The specifications of the sample of a ninth experimental example are as follows.

The recording layer 22 is formed of a stack structure that includes $ZnMn_2O_4$ with a thickness of about 10 nm, ZnO with a thickness of about 1 nm, and $ZrO_2$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Tenth Experimental Example

The specifications of the sample of a tenth experimental example are as follows.

The recording layer 22 is formed of a stack structure that includes $ZnCo_2O_4$ with a thickness of about 10 nm, ZnO with a thickness of about 2 nm, and $ReO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Eleventh Experimental Example

The specifications of the sample of an eleventh experimental example are as follows.

The recording layer 22 is formed of a stack structure that includes $NaFeO_2$ with a thickness of about 10 nm, $NaAlO_2$ with a thickness of about 2 nm, and $WO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Twelfth Experimental Example

The specifications of the sample of a twelfth experimental example are as follows.

The recording layer 22 is formed of a stack structure that includes $NaFeO_2$ with a thickness of about 10 nm, $NaYF_4$ with a thickness of about 2 nm, and $ReO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Thirteenth Experimental Example

The specifications of the sample of a thirteenth experimental example are as follows.

The recording layer 22 is formed of a stack structure that includes $MgMn_2O_4$ with a thickness of about 10 nm, $MgAl_2O_4$ with a thickness of about 2 nm, and $ReO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Fourteenth Experimental Example

The specifications of the sample of a fourteenth experimental example are as follows.

The recording layer 22 is formed of a stack structure that includes $MgMn_2O_4$ with a thickness of about 10 nm, MgO with a thickness of about 2 nm, and $WO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Fifteenth Experimental Example

The specifications of the sample of a fifteenth experimental example are as follows.

The recording layer 22 is formed of a stack structure that includes $MgMoO_3$ with a thickness of about 10 nm, $MgSnO_3$ with a thickness of about 2 nm, and $WO_3$ with a thickness of about 5 nm.

In this case, the result is expected that the resistance value in the reset state is at the level of $10^7 \Omega$, and the resistance value in the set state is at the level of $10^4 \Omega$. Furthermore, the cycle lifetime is expected to be not less than a hundred thousand cycles.

Comparative Example

The specifications of the sample of a comparative example are as follows.

The recording layer 22 is formed of a stack structure that includes $Zn_{1.1}Mn_{1.9}O_4$ with a thickness of about 10 nm and $TiO_2$ with a thickness of about 5 nm.

In this case, the cycle lifetime is expected to be not less than a hundred thousand cycles as in the cases of the first to fifteenth experimental examples. The resistance value in the reset state is expected to be at the level of $10^7 \Omega$ as in the cases of the first to fifteenth experimental examples. However, the resistance value in the set state is expected to be low values of $10^2$ to $10^3 \Omega$.

As described above, all of the samples of the first to fifteenth experimental examples satisfy the basic operation of writing, erasing, and readout and a sufficient cycle lifetime. Furthermore, in these experimental examples, the resistance value at the time of the set is higher than the comparative example by about one to two digits. That is, a good ON resistance is obtained. This enables efficient Joule heating of the recording layer and reduces the ON current of the recording layer. Thereby, power consumption is reduced.

FIG. 34 is a table illustrating expectation values of the first to fifteenth experimental examples and the comparative example.

As described above, according to embodiments of the invention, since the information recording (writing) is performed only in a portion (recording unit) to which an electric field is applied, information can be recorded in a very minute region with very low power consumption. This enables simultaneous parallel processing of a large number of cells and very high speed operation per chip.

Furthermore, although the erasing is performed by applying heat, using the material presented by examples of this embodiment causes almost no structural changes of oxide, and therefore the erasing can be performed with low power consumption. Alternatively, the erasing can be performed also by applying an electric field in the direction opposite to that at the time of recording. In this case, since energy loss, that is, thermal diffusion is small, the erasing can be performed with lower power consumption.

Furthermore, according to this embodiment, since a conductive portion is formed in an insulator after writing, a current flows concentratedly through the conductor portion during readout, and a recording principle with a very high sensing efficiency can be provided.

Furthermore, according to this embodiment, an easily movable cation and a transition element ion that stably retains the matrix structure are combined, and thereby the recording and erasing can be repeated stably.

Moreover, in the case where the recording layer described above in regard to the second specific example or the fourth specific example is used for the recording layer, by providing a high-resistivity insulating layer having an appropriate film thickness, the ON resistance value can be set to an appropriate value to efficiently Joule-heat the recording layer during the reset operation, without inhibiting switching. Thereby, power consumption is reduced. Furthermore, the resistance of the recording layer in the ON state increases to reduce the ON current. Thereby, various operations can be performed with very low power consumption per cell.

Thus, examples of this embodiment enable information recording at a recording density that cannot be achieved by conventional technology, and enable high-speed operations, in spite of a very simple mechanism. Therefore, the examples of this embodiment are highly advantageous to industry as next-generation technology that breaks through the recording density barrier of current nonvolatile memory.

Examples of this embodiment are not limited to the embodiments described above, but may be embodied with alteration of the components without departing from the purport of this embodiment. The examples of this embodiment define the set and reset by taking the state immediately after film-formation as the initial state. However, the definition of the set and reset is optional, and is not limited to the examples of this embodiment. Furthermore, various inventions can be designed by appropriately combining the plurality of components disclosed in the embodiments described above. For example, some of all the components disclosed in the embodiments described above may be removed, or components of different embodiments may be appropriately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An information recording and reproducing device comprising:
    a first layer;
    a second layer; and
    a recording layer provided between the first layer and the second layer and being capable of reversibly changing between a first state having a first resistance and a second state having a second resistance higher than the first resistance by a current supplied via the first layer and the second layer,
    the recording layer including:
        a first compound layer; and
        an insulating layer,
    the first compound layer containing a first compound,
    the first compound including a first cation element and a second cation element of a type different from the first cation element, at least one of the first cation element and the second cation element being a transition element having a d-orbital partially filled with electron, at least one of the first cation element and the second cation element being an element selected from group 1 to 4 elements and group 12 to 17 elements in a periodic table,
    the insulating layer containing a third compound, and
    the third compound including an element selected from group 1 to 4 elements and group 12 to 17 elements in the periodic table.

2. The device according to claim 1, wherein the insulating layer is provided between the first layer and the first compound layer.

3. The device according to claim 1, wherein the element selected from the group 1 to 4 elements and the group 12 to 17 elements in the periodic table and included in the third compound is an element identical to the element selected from the group 1 to 4 elements and the group 12 to 17 elements in the periodic table and included in the first compound.

4. The device according to claim 1, wherein
    the third compound is expressed by one compositional formula of $AX$, $AMX_2$, $AM_2X_4$, $A_2MX_4$, $AMX_3$, and $AMX_4$,
    A is at least one element selected from the group consisting of Na, K, Rb, Be, Mg, Ca, Sr, Ba, Al, Ga, Zn, and Cd, M is at least one element selected from the group consisting of B, Al, Ga, In, Si, Ge, Sn, Ti, Zr, Hf, As, Sb, Pb, Bi, Sc, Y, and Ln (lanthonoids) and is an element different from A, and X is at least one element selected from the group consisting of F, O, and N.

5. The device according to claim 4, wherein the A is at least one element selected from the group consisting of Be, Mg, Ca, Sr, Ba, Zn, and Cd.

6. The device according to claim 4, wherein the A is at least one element selected from the group consisting of Mg and Zn.

7. The device according to claim 4, wherein the A is Zn.

8. The device according to claim 4, wherein the M is at least one element selected from the group consisting of Al and Ga.

9. The device according to claim 1, wherein the third compound has at least one structure selected from the group consisting of spinel structure, ilmenite structure, wolframite structure, $\alpha$-NaFeO$_2$ structure, LiMoN$_2$ structure, zinc blende structure, rock salt structure, and fluorite structure.

10. The device according to claim 1, wherein crystal structure and crystal orientation of the first compound and the third compound are identical.

11. The device according to claim 1, wherein
the recording layer further includes a second compound layer provided between the insulating layer and the first layer or between the insulating layer and the second layer and containing a second compound, and
the second compound includes a transition element having a d-orbital partially filled with electron.

12. The device according to claim 11, wherein the second compound has at least one structure selected from the group consisting of hollandite structure, ramsdellite structure, anatase structure, brookite structure, pyrolusite structure, ReO$_3$ structure, MoO$_{1.5}$PO$_4$ structure, TiO$_{0.5}$PO$_4$ structure, FePO$_4$ structure, $\beta$MnO$_2$ structure, $\gamma$MnO$_2$ structure, $\lambda$MnO$_2$ structure, spinel structure, and ilmenite structure.

13. The device according to claim 11, wherein crystal structure and crystal orientation of the first compound, the second compound and the third compound are identical.

14. The device according to claim 1, wherein the insulating layer has a thickness of 10 nanometers or less.

15. The device according to claim 1, wherein the insulating layer has a resistivity of 10$^3$ $\Omega$cm or more.

16. The device according to claim 1, further comprising:
a first interconnection extending in a first direction; and
a second interconnection extending in a second direction intersecting with the first direction,
a stacked body including the first layer, the second layer, and the recording layer, the stacked body being connected to the first interconnection and the second interconnection at an intersection of the first interconnection and the second interconnection and being supplied with the current via the first and second interconnections.

17. The device according to claim 16, further comprising: a rectifying element provided between the first interconnection and the stacked body or between the second interconnection and the stacked body.

18. The device according to claim 17, further comprising: a barrier layer provided between the first interconnection and the rectifying element or between the second interconnection and the rectifying element, the barrier layer suppressing diffusion of at least one of an element contained in the first interconnection, an element contained in the second interconnection, and an element contained in the rectifying element.

19. The device according to claim 1, further comprising: a voltage application unit applying a voltage to the recording layer to reversibly change the recording layer between the first state and the second state.

20. The device according to claim 19, wherein
the recording layer includes a plurality of recording units and
the voltage application unit includes a probe to apply the voltage locally to the plurality of recording units.

* * * * *